(12) United States Patent
Jeong et al.

(10) Patent No.: US 9,000,543 B2
(45) Date of Patent: Apr. 7, 2015

(54) COMBINED SENSOR

(75) Inventors: Heewon Jeong, Tokyo (JP); Masahide Hayashi, Mito (JP); Kiyoko Yamanaka, Tachikawa (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 124 days.

(21) Appl. No.: 13/991,749

(22) PCT Filed: Nov. 22, 2011

(86) PCT No.: PCT/JP2011/076884
§ 371 (c)(1),
(2), (4) Date: Jul. 18, 2013

(87) PCT Pub. No.: WO2012/077494
PCT Pub. Date: Jun. 14, 2012

(65) Prior Publication Data
US 2013/0285172 A1   Oct. 31, 2013

(30) Foreign Application Priority Data
Dec. 6, 2010   (JP) ................. 2010-271387

(51) Int. Cl.
*H01L 29/84* (2006.01)
*B81B 3/00* (2006.01)
*G01C 19/574* (2012.01)
*G01P 15/125* (2006.01)
*G01P 15/18* (2013.01)

(52) U.S. Cl.
CPC ............ *B81B 3/0018* (2013.01); *G01C 19/574* (2013.01); *G01P 15/125* (2013.01); *G01P 15/18* (2013.01)

(58) Field of Classification Search
USPC .................. 257/415–420, E29.105, E21.002
See application file for complete search history.

(56) References Cited

U.S. PATENT DOCUMENTS

| 5,583,296 A | 12/1996 | Mokwa et al. |
| 6,631,645 B1 | 10/2003 | Satou et al. |
| 7,972,886 B2 * | 7/2011 | Jeong et al. ..................... 438/50 |
| 2002/0051258 A1 | 5/2002 | Tamura |
| 2008/0042260 A1 * | 2/2008 | Jeong et al. ................... 257/704 |
| 2013/0113056 A1 * | 5/2013 | Hashimoto ................... 257/417 |

FOREIGN PATENT DOCUMENTS

| JP | 8-501156 A | 2/1996 |
| JP | 10-239347 A | 9/1998 |

(Continued)

OTHER PUBLICATIONS

Corresponding International Search Report with English Translation dated Mar. 6, 2012 (two (2) pages).

*Primary Examiner* — Cuong Q Nguyen
(74) *Attorney, Agent, or Firm* — Crowell & Moring LLP

(57) ABSTRACT

To provide a combined sensor that can detect a plurality of physical quantities. With the combined sensor, it is possible to realize, while maintaining performance, a reduction in size and a reduction in costs by increasing elements that can be shared among respective sensors. A weight M2 and a detection electrode DTE2 used in an angular-velocity detecting section are also used as a reference capacitive element of a Z-direction-acceleration detecting section configured to detect acceleration in a Z direction. That is, in the Z-direction-acceleration detecting section, a detection capacitive element including the weight M2 and the detection electrode DTE2 configuring the angular-velocity detecting section is used as a reference capacitive element for a detection capacitive element formed by a detection electrode DTE5 and a weight M4.

14 Claims, 13 Drawing Sheets

(56) References Cited

FOREIGN PATENT DOCUMENTS

| | | |
|---|---|---|
| JP | 2001-235381 A | 8/2001 |
| JP | 2002-5950 A | 1/2002 |
| JP | 2009-270944 A | 11/2009 |
| JP | 2010-85313 A | 4/2010 |
| WO | WO 2010/032818 A1 | 3/2010 |

* cited by examiner $$C = \varepsilon \frac{S}{d(x)}$$

$$C = \varepsilon \frac{S(x)}{d}$$

COMBINED SENSOR

TECHNICAL FIELD

The present invention relates to a combined sensor and, more particularly, to a technique effectively applied to a combined sensor formed by a semiconductor micromachining technique and configured by micro electro mechanical systems (MEMS) that detect physical quantities related to acceleration, an angular velocity (rotation), pressure, and the like as changes in capacitance.

BACKGROUND ART

There is proposed a capacitive combined sensor in which detecting sections that can detect acceleration and angular velocities as a plurality of physical quantities are combined and formed on one substrate. For example, JP-A-10-239347 (Patent Literature 1) and JP-A-2002-005950 (Patent Literature 2) respectively disclose examples of the combined sensor. The combined sensor disclosed in Patent Literature 1 and Patent Literature 2 detects motions in a plane of a device layer in which a movable section is formed. A detection capacitor, the capacitance of which increases according to the motion of the movable section, and a detection capacitor, the capacitance of which decreases according to the motion of the movable section, are formed in the same plane. The two capacitances are differentially input to a capacitance-to-voltage conversion section (a C/V conversion section), whereby an output of a signal to be detected is obtained. Since an angular velocity sensor and an acceleration sensor are provided on the same substrate, there is an advantage that the combined sensor can be manufacture inexpensively and can be easily reduced in size.

JP-T-8-501156 (the term "JP-T" as used herein means a published Japanese translation of PCT patent Application) (Patent Literature 3) and JP-A-2001-235381 (Patent Literature 4) respectively disclose examples of pressure sensors. In the pressure sensors disclosed in Patent Literature 3 and Patent Literature 4, a pressure-sensitive capacitive element, the capacitance of which changes according to application of pressure, and a reference capacitive element having a reference capacitor, the capacitance of which is invariable with respect to pressure to be detected, are formed on one substrate. The pressure sensor outputs a signal corresponding to a ratio of the two capacitances to thereby detect pressure.

CITATION LIST

Patent Literature

Patent Literature 1: JP-A-10-239347
Patent Literature 2: JP-A-2002-005950
Patent Literature 3: JP-T-8-501156
Patent Literature 4: JP-A-2001-235381

SUMMARY OF INVENTION

Technical Problem

The combined sensor described in Patent Literature 1 and Patent Literature 2 that can detect acceleration and an angular velocity can sensitively detect displacement in a principal plane of a semiconductor substrate by forming a differential capacitor. However, as in the pressure sensors described in Patent Literature 3 and Patent Literature 4, a fixed reference capacitive element to be compared is necessary for displacement in an out-of-plane direction in which the movable section moves in a direction perpendicular to the device layer (the principal plane of the semiconductor substrate). This is because, when acceleration is applied in the out-of-plane direction, it is difficult to form both of the detection capacitor, the capacitance of which increases according to the motion of the movable section, and the detection capacitor, the capacitance of which decreases according to the motion of the movable section. Therefore, when a combined sensor that can measure acceleration and an angular velocity in the out-of-plane direction is formed, as a sensor element in which a movable section and the like are formed, a sensor element for a reference capacitive element needs to be formed. The size of the sensor element is not very different from the size of two sensor elements simply arranged crosswise. Consequently, a problem occurs in that a reduction in size of the sensor element through compounding of sensors and a reduction effect of manufacturing costs though an increase in the number of acquired chips per one semiconductor wafer are limited.

It is an object of the present invention to provide a combined sensor that can detect a plurality of physical quantities. With the combined sensor, it is possible to realize, while maintaining performance, a reduction in size and a reduction in costs by increasing elements that can be shared among respective sensors.

The object and other objects and new characteristics of the present invention will be made apparent by the description of this specification and the attached drawings.

Solution to Problem

Overviews of representative inventions among inventions disclosed in this application are briefly explained below.

A combined sensor in a representative embodiment includes (a) a first detecting section configured to grasp application of a first physical quantity as a change in the capacitance of a first detection capacitive element and (b) a second detecting section configured to grasp application of a second physical quantity as a change in the capacitance of a second detection capacitive element. The combined sensor is characterized by detecting the first physical quantity on the basis of a difference between a detection signal obtained by converting the capacitance of the first detection capacitive element output from the first detecting section and a reference signal obtained by converting the capacitance of the second detection capacitive element output from the second detecting section.

A combined sensor in a representative embodiment includes (a) a first detecting section configured to grasp application of a first physical quantity as a change in the capacitance of a first detection capacitive element, (b) a second detecting section configured to grasp application of a second physical quantity as a change in the capacitance of a second detection capacitive element, and (c) a reference capacitive element set as a reference for calculating a difference. The combined sensor is characterized by detecting the first physical quantity on the basis of a difference between a first detection signal obtained by converting the capacitance of the first detection capacitive element output from the first detecting section and a reference signal obtained by converting the capacitance of the reference capacitive element and detecting the second physical quantity on the basis of a difference between a second detection signal obtained by converting the capacitance of the second detection capacitive element output from the second detecting section and the reference signal obtained by converting the capacitance of the reference capacitive element.

Advantageous Effect of Invention

An effect obtained by the representative inventions among the inventions disclosed in this application is briefly explained below.

In a combined sensor that can detect a plurality of physical quantities, it is possible to realize, while maintaining performance, a reduction in size and a reduction in costs by increasing elements that can be shared among respective sensors.

DESCRIPTION OF EMBODIMENTS

Figure 1:
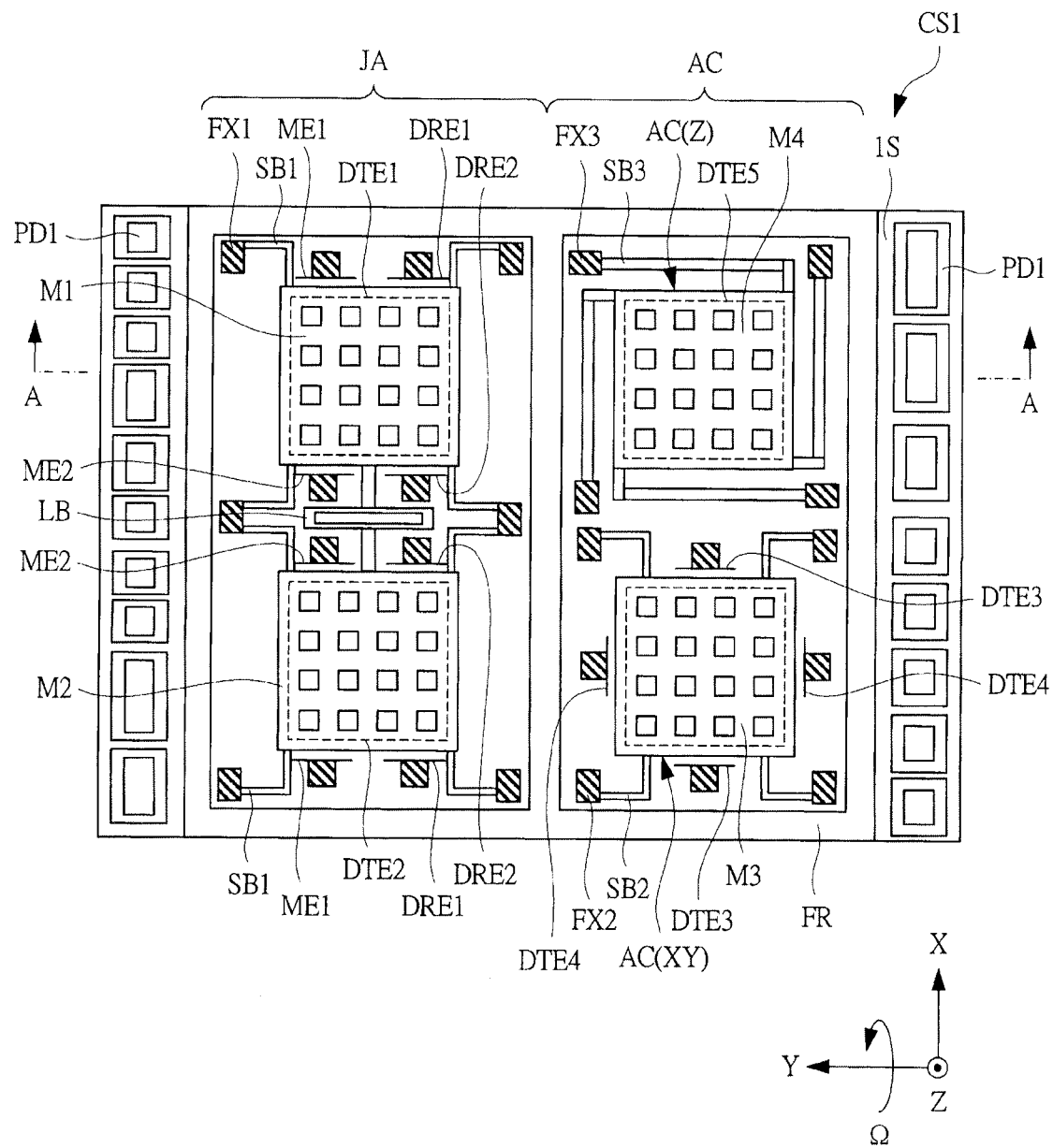
FIG. 1 is a plan view showing the configuration of a combined sensor in a first embodiment of the present invention.

In embodiments explained below, when necessary for convenience, an embodiment is divided into a plurality of sections or embodiments and explained. However, except when clearly indicated in particular, the sections or the embodiments are not unrelated to one another but are in a relation in which one is a modification, details, supplementary explanation, or the like of a part or all of the other.

In the embodiments explained below, when the number and the like (including the number, numerical values, amounts, and ranges) of elements are referred to, except, for example, when clearly indicated in particular and when the number is clearly limited to a specific number in principle, the number is not limited to the specific number and may be equal to or larger than or equal to or smaller than the specific number.

Further, in the embodiments explained below, except, for example, when clearly indicated in particular and when considered obviously essential in principle, it is needless to say that constituent elements (including element steps) of the embodiments are not always essential.

Similarly, in the embodiments, when shapes, a positional relation, and the like of the constituent elements and the like are referred to, except, for example, when clearly indicated in particular and when considered obviously unlikely, the shapes and the like include those substantially approximate or similar thereto. This holds true concerning the numerical values and the ranges.

In all figures for explaining the embodiments, the same members are denoted by the same reference numerals and signs as a general rule and repeated explanation of the members is omitted. Note that, to clearly show a drawing, hatching is sometimes applied to the drawing even if the drawing is a plan view.

First Embodiment

<Configuration of a Combined Sensor in a First Embodiment>

The configuration of a combined sensor CS1 in the first embodiment is explained with reference to the drawings. FIG. 1 is a plan view showing the configuration of the combined sensor CS1 in the first embodiment. In FIG. 1, the combined sensor CS1 in the first embodiment includes a frame body FR formed on a semiconductor substrate 1S. In regions partitioned by the frame body FR, an angular-velocity detecting section JA configured to detect an angular velocity around a Y axis and an acceleration detecting section AC configured to detect accelerations in an X-axis direction, a Y-axis direction, and a Z-axis direction are formed. The acceleration detecting section AC is configured by an XY-direction-acceleration detecting section AC(XY) configured to detect accelerations in the X-axis direction and the Y-axis direction and a Z-direction-acceleration detecting section AC(Z) configured to detect acceleration in the Z-axis direction.

First, the configuration of the angular-velocity detecting section JA is explained. As shown in FIG. 1, the angular-velocity detecting section JA includes two movable (vibratable) weights (movable sections) M1 and M2 formed on the semiconductor substrate 1S and further includes a link beam LB. The link beam LB couples the two weights M1 and M2. Consequently, the link beam LB forms a transmission route of vibration energy of the weight M1 and the weight M2, whereby a tuning fork structure (an opposite phase vibration structure) is formed. The angular-velocity detecting section JA includes a supporting beam SB1 configured to support the weights M1 and M2 and the link beam LB in a floating state a fixed distance apart from the semiconductor substrate 1S. The supporting beam SB1 is configured to be deformable (elastically deformable) in both directions, i.e., a driving direction (the X direction) and a detecting direction (the Z direction). That is, one end of the supporting beam SB1 is connected to the weight M1 and the weight M2 and the other end of the supporting beam SB1 is connected to a fixed section FX1 fixed to the semiconductor substrate 1S.

Further, the angular-velocity detecting section JA includes a driving electrode DRE1 and a driving electrode DRE2 configured to form capacitors between the driving electrodes DRE1 and DRE2 and the weight M1. That is, a driving capacitive element is formed by the weight M1 and the driving electrode DRE1 and a driving capacitive element is formed by the weight M1 and the driving electrode DRE2. Similarly, a driving capacitive element is formed by the weight M2 and the driving electrode DRE1 and a driving capacitive element is formed by the weight M2 and the driving electrode DRE2. For example, the driving capacitive element configured from the driving electrode DRE1 and the weight M1 is configured to be applied with a high-frequency signal (a high-frequency voltage). Electrostatic attraction is generated in the driving capacitive element applied with the high-frequency signal (the high-frequency voltage). The weight M1 can be vibrated by the electrostatic attraction. Similarly, the driving capacitive element configured from the driving electrode DRE2 and the weight M1, the driving capacitive element configured from the driving electrode DRE1 and the weight M2, or the driving capacitive element configured from the driving electrode DRE2 and the weight M1 is configured the same. Consequently, the weight M1 and the weight M2 vibrate like a tuning fork.

The angular-velocity detecting section JA includes a monitor electrode ME1 and a monitor electrode ME2 for watching (monitoring) driving amplitude of the weight M1 and the weight M2 vibrating like a tuning fork. Further, the angular-velocity detecting section JA includes a detection electrode DTE1 and the detection electrode DTE2 for detecting displacement in the detecting direction (the Z-axis direction) when an angular velocity around the Y-axis direction is applied. That is, for example, a detection capacitive element is formed by the weight M1 and the detection electrode DTE1 formed in a lower layer of the weight M1 and is configured to be capable of grasping displacement in the detecting direction as a capacitance change of the detection capacitive element. Similarly, a detection capacitive element is formed by the weight M2 and the detection electrode DTE2 formed in a lower layer of the weight M2 and is configured to be capable of grasping displacement in the detecting direction as a capacitance change of the detection capacitive element. In the angular-velocity detecting section JA configured in this way, a driving vibration system is formed by the weight M1, the weight M2, the link beam LB, and the supporting beam SB1. A detection vibration system is formed by the weight 1 and the supporting beam SB1 or the weight M2 and the supporting beam SB1.

Subsequently, the configuration of the acceleration detecting section AC is explained. As the acceleration detecting section AC, there are the XY-direction-acceleration detecting section AC(XY) configured to detect accelerations in the X-axis direction and the Y-axis direction and the Z-direction-acceleration detecting section AC(Z) configured to detect acceleration in the Z-axis direction. First, the configuration of the XY-direction-acceleration detecting section AC(XY) is explained. As shown in FIG. 1, the XY-direction-acceleration detecting section AC(XY) includes one movable weight M3 formed on the semiconductor substrate 1S. The XY-direction-acceleration detecting section AC(XY) includes a supporting beam SB2 configured to support the weight M3 in a floating state a fixed distance apart from the semiconductor substrate 1S. The supporting beam SB2 is configured to be deformable (elastically deformable) in both directions of the detecting direction (the X direction) and the detecting direction (the Y direction). That is, one end of the supporting beam SB2 is connected to the weight M3 and the other end of the supporting beam SB2 is connected to a fixed section FX2 fixed to the semiconductor substrate 1S.

Further, the XY-direction-acceleration detecting section AC(XY) includes a detection electrode DTE3 for detecting displacement in the detecting direction (the X-axis direction) when acceleration is applied in the X direction. That is, for example, a detection capacitive element is formed by the weight M3 and the detection electrode DTE3 and configured to be capable of grasping the displacement in the detecting direction (the X-axis direction) as a capacitance change of the detection capacitive element. Similarly, the XY-direction-acceleration detecting section AC(XY) includes a detection electrode (DTE4) for detecting displacement in the detecting direction (the Y-axis direction) when acceleration is applied in the Y direction. That is, for example, a detection capacitive element is formed by the weight M3 and the detection electrode DTE4 and configured to be capable of grasping the displacement in the detecting direction (the Y-axis direction) as a capacitance change of the detection capacitive element.

The configuration of the Z-direction-acceleration detecting section AC(Z) is explained. As shown in FIG. 1, the Z-direction-acceleration detecting section AC(Z) includes one movable weight M4 formed on the semiconductor substrate 1S. The Z-direction-acceleration detecting section AC(Z) includes a supporting beam SB3 configured to support the weight M4 in a floating state a fixed distance apart from the semiconductor substrate 1S. The supporting beam SB3 is configured to be deformable (elastically deformable) in the detecting direction (the Z direction). That is, one end of the supporting beam SB3 is connected to the weight M4 and the other end of the supporting beam SB3 is connected to a fixed section FX3 fixed to the semiconductor substrate 1S.

Further, the Z-direction-acceleration detecting section AC(Z) includes a detection electrode DTE5 for detecting displacement in the detecting direction (the Z-axis direction) when acceleration is applied in the Z direction. That is, a detection capacitive element is formed by the weight M4 and the detection electrode DTE5 formed in a lower layer of the weight M4 and is configured to be capable of grasping displacement in the detecting direction (the X-axis direction) as a capacitance change of the detection capacitive element.

Note that the weights M1 and M2, the link beam LB, the supporting beam SB1, and the fixed section FX1 configuring the angular-velocity detecting section JA are configured from a conductive member such as a polysilicon film. The fixed section FX1 is electrically connected to, for example, a pad PD1. Therefore, the angular-velocity detecting section JA is configured to be capable applying an electric signal to the weight M1 via the pad PD1, which is an external connection terminal, and from the fixed section FX1 via the supporting beam SB1. Similarly, the driving electrode DRE1, the driving electrode DRE2, the monitor electrode ME1, the monitor electrode ME2, the detection electrode DTE1, the detection electrode DTE2, and the like configuring the angular-velocity detecting section JA are also configured from a conductive member and electrically connected to the pad PD1, which is the external connection terminal. Therefore, the angular-velocity detecting section JA is configured to be capable of applying an electric signal to these components as well.

The weight M3, the supporting beam SB2, and the fixed section FX2 configuring the XY-direction-acceleration detecting section AC(XY) are configured from a conductive member such as a polysilicon film. The fixed section FX2 is electrically connected to, for example, the pad PD1. Therefore, XY-direction-acceleration detecting section AC(XY) is configured to be capable of applying an electric signal to the weight M3 via the pad PD1, which is the external connection terminal, and from the fixed section FX2 via the supporting beam SB2. Similarly, the detection electrode DTE3, the detection electrode DTE4, and the like configuring the XY-direction-acceleration detecting section AC(XY) are also configured from a conductive member and electrically connected to the pad PD1, which is the external connection terminal. Therefore, the XY-direction-acceleration detecting section AC(XY) is configured to be capable of applying an electric signal to these components as well.

Similarly, the weight M4, the supporting beam SB3, and the fixed section FX3 configuring the Z-direction-acceleration detecting section AC(Z) are configured from a conductive member such as a polysilicon film. The fixed section FX3 is electrically connected to, for example, the pad PD1. Therefore, the Z-direction-acceleration detecting section AC(Z) is configured to be capable of applying an electric signal to the weight M4 via the pad PD1, which is the external connection terminal, and from the fixed section FX3 via the supporting beam SB3. Further, the detection electrode DTE5 and the like configuring the Z-direction-acceleration detecting section AC(Z) are also configured from a conductive member and electrically connected to the pad PD1, which is the external connection terminal. Therefore, the Z-direction-acceleration detecting section AC (Z) is configured to be capable of applying an electric signal to these components as well.

Figure 2:
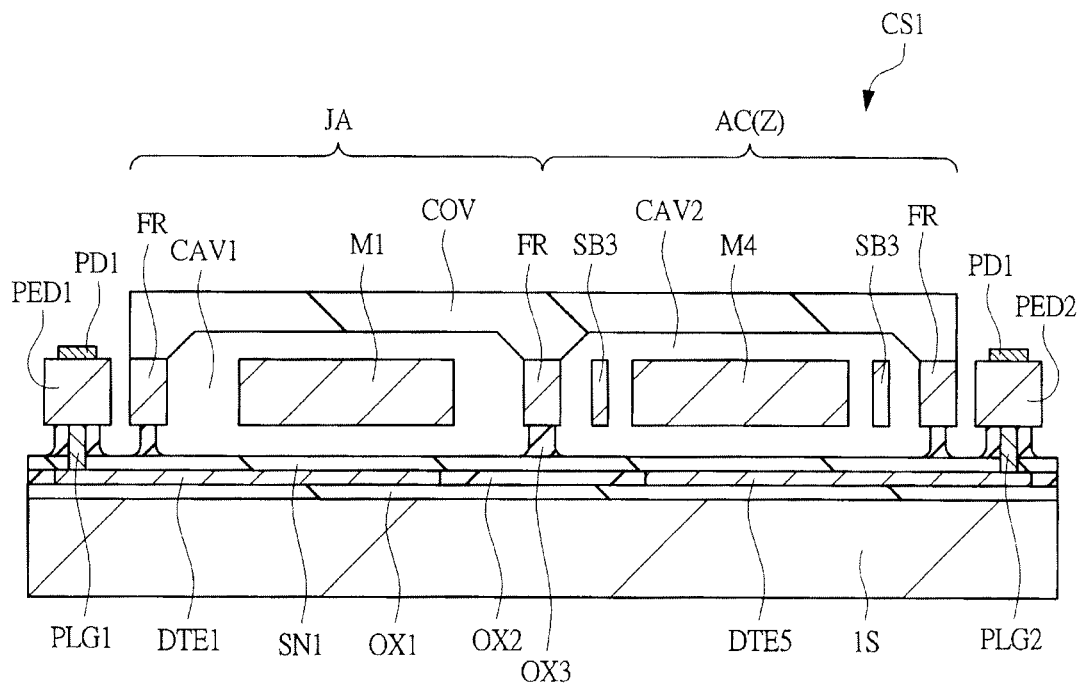
FIG. 2 is a sectional view taken along line A-A in FIG. 1.

A plane structure of the combined sensor CS1 in the first embodiment is schematically configured as explained above. A sectional structure of the combined sensor CS1 in the first embodiment is explained. FIG. 2 is a diagram showing the sectional structure of the combined sensor CS1 in the first embodiment and is a sectional view taken along line A-A in FIG. 1. As shown in FIG. 2, the combined sensor CS1 in the first embodiment includes the semiconductor substrate 1S made of, for example, silicon. An insulating film OX1 made of, for example, a silicon oxide film is formed on the semiconductor substrate 1S. The detection electrode DTE1 and the detection electrode DTE5 formed by patterning a conductive film such as a polysilicon film are formed on the insulating film OX1. An insulating film OX2 made of, for example, a silicon oxide film is formed to fill a gap formed between the detection electrode DTE1 and the detection electrode DTE5. The surfaces of the detection electrode DTE1 and the detection electrode DTE5 and the surface of the insulating film OX2 are aligned. An insulating film SN1 made of, for example, a silicon nitride film is formed on the aligned surfaces.

The frame body FR is formed on the insulating film SN1 via an insulating film OX3 made of, for example, a silicon oxide film. The frame body FR is made of a conductive film such as a polysilicon film and is provided to partition the forming region of the angular-velocity detecting section JA and the forming region of the acceleration detecting section AC shown in FIG. 1. A cavity section CAV1 is formed in one region partitioned by the frame body FR. The weight M1, which is a component of the angular-velocity detecting section JA, is formed in the cavity section CAV1. On the other hand, a cavity section CAV2 is formed in another region partitioned by the frame body FR. The weight M4 and the supporting beam SB3, which are components of the Z-direction-acceleration detecting section AC(Z), are formed in the cavity CAV2. The two regions partitioned by the frame body FR are closed by a cover COV. A plug PLG1 connected to, for example, the detection electrode DTE1 is formed on the outer left side of the frame body FR to pierce through the insulating film SN1 and the insulating film OX3. A pedestal section PED1 made of, for example, a polysilicon film is formed on the plug PLG1. The pad PD1 is formed on the pedestal section PED1. Therefore, it is seen that the detection electrode DTE1 is electrically connected to the pad PD1 via the plug PLG1 and the pedestal section PED1. Similarly, a plug PLG2 connected to, for example, the detection electrode DTE5 is formed on the outer right side of the frame body FR to pierce through the insulating film SN1 and the insulating film OX3. A pedestal section PED2 made of, for example, a polysilicon film is formed on the plug PLG2. The pad PD1 is formed on the pedestal section PED2. Therefore, it is seen that the detection electrode DTE5 is electrically connected to the pad PD1 via the plug PLG2 and the pedestal section PED2.

<Circuit Configuration for Detecting an Angular Velocity>

Figure 3:
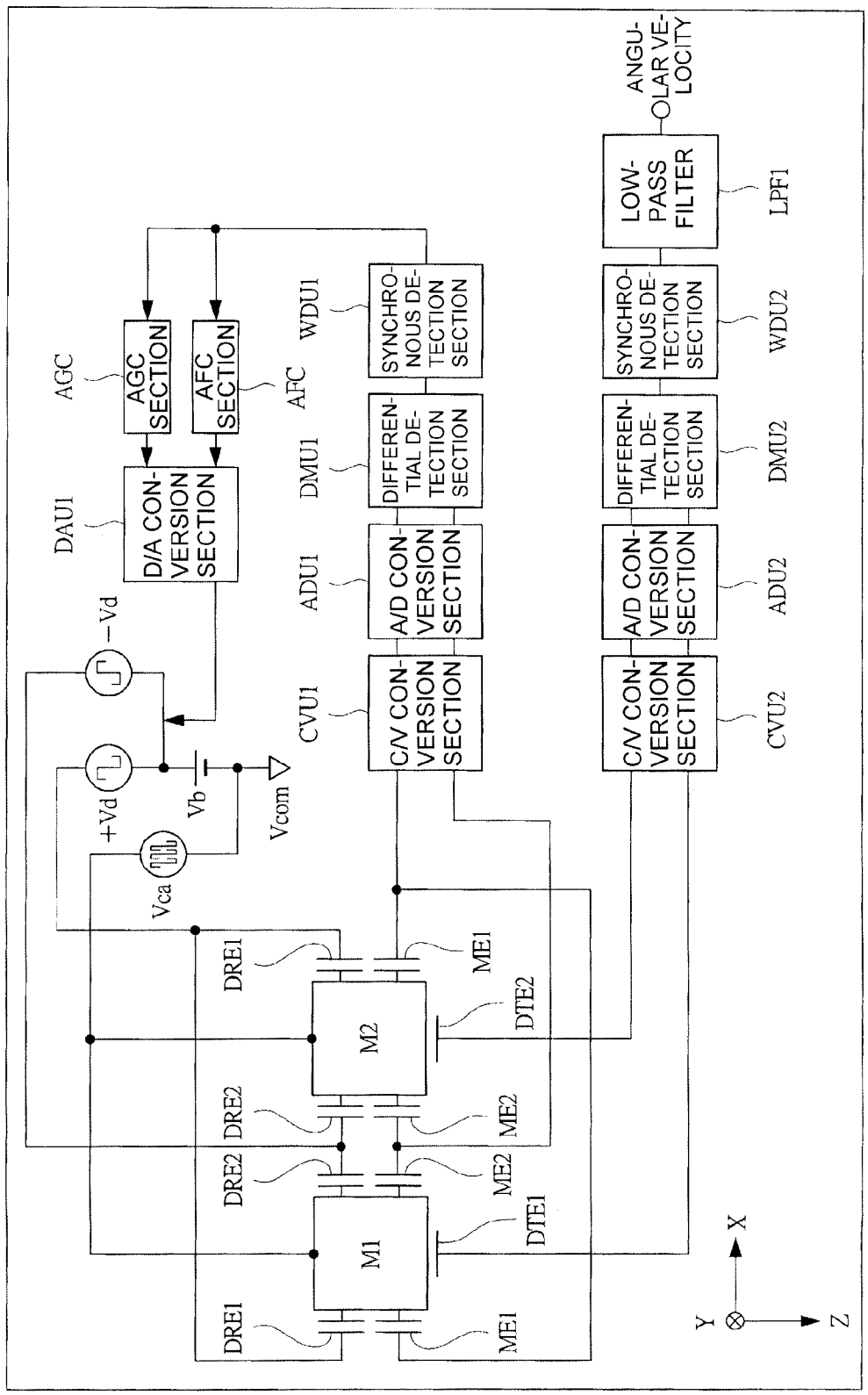
FIG. 3 is a block diagram showing a circuit configuration for detecting an angular velocity using an angular-velocity detecting section.

A circuit configuration for detecting an angular velocity using the angular-velocity detecting section is explained with reference to the figures. FIG. 3 is a block diagram showing a circuit configuration for detecting an angular velocity using the angular-velocity detecting section. As shown in FIG. 3, the driving electrode DRE1 is arranged on the outer side of the weight M1 and the weight M2. The driving electrode DRE2 is arranged on the inner side of the weight M1 and the weight M2. The driving capacitive elements are respectively formed by the driving electrode DRE1 and the weight M1, the driving electrode DRE1 and the weight M2, the driving electrode DRE2 and the weight M1, and the driving electrode DRE2 and the weight M2. At this point, Vcom+Vg+Vd is applied to the driving electrode DRE1 as a driving signal and Vcom+Vb−Vd is applied to the driving electrode DRE2 as a driving signal. Vcom and Vca are applied to the weight M1 and the weight M2. Vcom indicates a common voltage and Vb indicates a bias voltage. The common voltage (Vcom) and the bias voltage (Vb) are direct-current voltages. On the other hand, +Vd and −Vd indicate driving voltages and Vca indicates a carrier voltage. The driving voltages and the carrier voltage are alternating-current voltages.

Further, the monitor electrode ME1 is arranged on the outer side of the weight M1 and the weight M2. The monitor electrode ME2 is arranged on the inner side of the weight M1 and the weight M2. Monitor capacitive elements are respectively formed by the monitor electrode ME1 and the weight M1, the monitor electrode ME1 and the weight M2, the monitor electrode ME2 and the weight M1, and the monitor electrode ME2 and the weight M2. The monitor electrode ME1 connected to the weight M1 and the monitor electrode ME1 connected to the weight M2 are connected to each other and connected to a C/V conversion section CVU1. Similarly, the monitor electrode ME2 connected to the weight M1 and the monitor electrode ME2 connected to the weight M2 are connected to each other and connected to the C/V conversion section CVU1.

The C/V conversion section CVU1 is connected to the monitor electrode ME1 and configured to convert capacitance of the monitor capacitive element formed by the monitor electrode ME1 and the weight M1 and the monitor capacitive element formed by the monitor electrode ME1 and the weight M2 into a first analog voltage signal for monitor. Similarly, the C/V conversion section CVU1 is connected to the monitor electrode ME2 and configured to convert capacitance of the monitor capacitive element formed by the monitor electrode ME2 and the weight M1 and the monitor capacitive element formed by the monitor electrode ME2 and the weight M2 into a second analog voltage signal for monitor.

A A/D conversion section ADU1 is configured to receive the first analog voltage signal for monitor output from the C/V conversion section CVU1 and convert the first analog voltage signal for monitor into a first digital voltage signal for monitor and receive the second analog voltage signal for monitor output from the C/V conversion section CVU1 and convert the second analog voltage signal for monitor into a second digital voltage signal for monitor.

A differential detection section DMU1 is configured to calculate a difference between the first digital voltage signal for monitor and the second digital voltage signal for monitor output from the A/D conversion section ADU1 and output a differential voltage signal for monitor. A synchronous detection section WDU1 is configured to demodulate (down-convert) the differential voltage signal for monitor and output a demodulated voltage signal for monitor.

Further, an AGC section AGC is configured to control the amplitude of the driving voltage (+Vd or −Vd) constant on the basis of the demodulated voltage signal for monitor demodulated by the synchronous detection section WDU1. On the other hand, an AFC section AFC is configured to cause, on the basis of the demodulated voltage signal for monitor demodulated by the synchronous detection section WDU1, the frequency of the driving voltage (a driving frequency) to follow a change in a peculiar number of vibrations of the driving vibration system. AD/A conversion section DAU1 is configured to convert an analog signal generated by the AGC section AGC and an analog signal generated by the AFC section AFC into a digital signal.

The detection electrode DTE1 is arranged in a lower layer of the weight M1. The detection electrode DTE2 is arranged in a lower layer of the weight M2. Detection capacitive elements are respectively formed by the detection electrode DTE1 and the weight M1 and the detection electrode DTE2 and the weight M2. The detection electrode DTE1 and the detection electrode DTE2 are electrically connected to the C/V conversion section CVU2.

The C/V conversion section CVU2 is connected to the detection electrode DTE1 and configured to convert the capacitance of the detection capacitive element formed by the detection electrode DTE1 and the weight M1 into a first analog voltage signal for detection. Similarly, the C/V conversion section CVU2 is connected to the detection electrode DTE2 and configured to convert the capacitance of the detection capacitive element formed by the detection electrode DTE2 and the weight M2 into a second analog voltage signal for detection.

An A/D conversion section ADU2 is configured to receive the first analog voltage signal for detection output from the C/V conversion section CVU2 and convert the first analog voltage signal for detection into a first digital voltage signal for detection and receives the second analog voltage signal for detection output from the C/V conversion section CVU2 and convert the second analog voltage signal for detection into a second digital voltage signal for detection.

A differential detection section DMU2 is configured to calculate a difference between the first digital voltage signal for detection and the second digital voltage signal for detection output from the A/D conversion section ADU2 and output a differential voltage signal for detection. A synchronous detection section WDU2 is configured to demodulate the differential voltage signal for detection and output a demodulated voltage signal for detection. Further, a low-pass filter LPF1 is configured to allow a signal having a frequency lower than a specific frequency to pass and attenuate and interrupt a signal having a frequency higher than the specific frequency.

<Principle and Operation for Detecting an Angular Velocity>

In the first embodiment, a circuit for detecting an angular velocity using the angular-velocity detecting section is configured as explained above. A principle and an operation for detecting an angular velocity using the circuit configured as explained above are explained with reference to FIG. 3.

First, in FIG. 3, the weight M1 and the weight M2 are excited in the X direction respectively by the driving electrode DRE1 arranged on the outer side of the weight M1 and the weight M2 and the driving electrode DRE2 arranged on the inner side of the weight M1 and the weight M2. Specifically, Vcom+Vb+Vd is applied to the driving electrode DRE1 as a driving signal and Vcom+Vb−Vd is applied to the driving electrode DRE2 as a driving signal. On the other hand, Vcom+Vca is applied to the weight M1 and the weight M2. Therefore, for example, a potential difference between the weight M1 and the driving electrode DRE1 is Vb+Vd and a potential difference between the weight M1 and the driving electrode DRE2 is Vb−Vd. Similarly, a potential difference between the weight M2 and the driving electrode DRE1 is Vb+Vd and a potential difference between the weight M2 and the driving electrode DRE2 is Vb−Vd. At this point, the driving capacitive elements are respectively formed by the driving electrode DRE1 and the weight M1, the driving electrode DRE1 and the weight M2, the driving electrode DRE2 and the weight M1, and the driving electrode DRE2 and the weight M2. The potential difference explained above is generated in these driving capacitive elements. Consequently, an electrostatic force is generated in each of the driving capacitive elements. The weight M1 and the weight M2 vibrate in opposite phases on the basis of the electrostatic force. That is, the weight M1 and the weight M2 are driven to vibrate.

The carrier voltage (Vca) is applied to the weight M1 and the weight M2 besides the common voltage (Vcom). However, the frequency of the carrier voltage (Vca) is several hundred kilohertz and is high enough for disabling the driving vibration system of the weight M1 and the weight M2 to follow the carrier voltage (Vca). Therefore, the carrier voltage (Vca) does not act as a driving force for vibrating the weight M1 and the weight M2.

Expression (1) is an expression indicating a relation between the amplitude of driving vibration in the X direction (driving amplitude AX) and a Coriolis force Fc. Expression (2) is an expression indicating a relation between detection amplitude z in the Z direction and the Coriolis force Fc.

$$Fc = 2 \times m \times \Omega \times AX \times \omega x \times \cos(\omega x \times t) \tag{1}$$

where, Fc indicates the Coriolis force, m indicates the mass of a weight, Ω indicates an angular velocity to be applied, AX indicates the driving amplitude, ωx/2π indicate a driving frequency, and t indicates time.

$$z = Fc \times Qz \times kz \tag{2}$$

where, Fc indicates the Coriolis force, z indicates detection amplitude, Qz indicates a mechanical quality coefficient in the detecting direction (the Z direction), and kz indicates a spring constant in the z direction of a supporting beam.

In Expression (1) and Expression (2), if it is assumed that the mass m of the weight M1 and the weight M2, a driving angular frequency ωx (since a frequency is obtained if divided by the driving angular frequency is divided by 2π, the driving angular frequency and the driving frequency are used together), and the angular velocity Ω to be applied are fixed, the Coriolis force Fc and the detection amplitude z converted as an output of an angular velocity sensor are a function of only the driving amplitude AX. Therefore, even when fluctuation in peripheral pressure and vibration disturbance occur, in order to maintain the sensitivity of the angular velocity sensor constant and secure reliability, the driving amplitude AX only has to be controlled to be constant. From this viewpoint, in the first embodiment, the driving amplitude AX is always monitored and feedback control is performed to fix the monitored driving amplitude AX, whereby the sensitivity of the angular velocity sensor is maintained constant and reliability is secured.

In the following explanation, the feedback control is explained. The angular-velocity detecting section in the first embodiment monitors the driving amplitude AX using the monitor electrode ME1 arranged on the outer side of the weight M1 and the weight M2 and the monitor electrode ME2 arranged on the inner side of the weight M1 and the weight M2. Specifically, the angular-velocity detecting section monitors the driving amplitude AX by detecting capacitance changes of the monitor capacitive elements respectively configured by the weight M1 and the monitor electrode ME1, the weight M2 and the monitor electrode ME1, the weight M1 and the monitor electrode ME2, and the weight M2 and the monitor electrode ME2. A principle of monitoring the driving amplitude AX is explained with reference to FIG. 3.

The carrier voltage (Vca) of several hundred kilohertz is applied to the weight M1 and the weight M2. The carrier voltage (Vca) causes movement of charges in the monitor electrode ME1 and the monitor electrode ME2 according to the capacitance of the monitor capacitive elements. According to the movement of the charges in the monitor electrode ME1, the first analog voltage signal for monitor is generated in the C/V conversion section CVU1. Similarly, according to the movement of the charges in the monitor electrode ME2, the second analog voltage signal for monitor is generated in the C/V conversion section CVU1. The first analog voltage signal for monitor and the second analog voltage signal for monitor generated in the C/V conversion section CVU1 are respectively converted into the first digital voltage signal for monitor and the second digital voltage signal for monitor in the A/D conversion section ADU1. Thereafter, the first digital voltage signal for monitor and the second digital voltage signal for monitor output from the A/D conversion section ADU1 are input to the differential detection section DMU1 and a difference between the first digital voltage signal for monitor and the second digital voltage signal for monitor is calculated. Specifically, the differential detection section DMU1 calculates a difference between the first digital voltage signal for monitor and the second digital voltage signal for monitor and outputs a differential voltage signal for monitor.

At this point, when the weight M1 and the weight M2 are not driven to vibrate, that is, when the driving amplitude AX is 0, only the carrier voltage (Vca) is applied to the weight M1 and the weight M2. The carrier voltage (Vca) is a high-frequency voltage as high as several hundred kilohertz. Since the weight M1 and the weight M2 cannot follow the carrier voltage (Vca), the weight M1 and the weight M2 change to a stationary state. In this case, the capacitance of the monitor capacitive element by the monitor electrode ME1 and the capacitance of the monitor capacitive element by the monitor electrode ME2 are equal. Therefore, the first analog voltage signal for monitor and the second analog voltage signal for monitor generated by the C/V conversion section CVU1 are equal. Therefore, the first digital voltage signal for monitor obtained by converting the first analog voltage signal for monitor in the A/D conversion section ADU1 and the second digital voltage signal for monitor obtained by converting the second analog voltage signal for monitor in the A/D conversion section ADU1 are also equal. Consequently, when the weight M1 and the weight M2 are not driven to vibrate, that is, when the driving amplitude AX is zero, the differential voltage signal for monitor generated in the differential detection section DMU1 is zero.

On the other hand, when the weight M1 and the weight M2 are driven to vibrate (vibrate in opposite phases), that is, when the driving amplitude AX is not zero, the carrier voltage (Vca) and the driving voltage (+Vd or −Vd) are applied to the weight M1 and the weight M2. Therefore, when the weight M1 and the weight M2 vibrate in opposite phases, in proportion to the driving amplitude AX of the weight M1 and the weight M2, for example, a change in which the capacitance of the monitor capacitive element including the monitor electrode ME1 as a component increases and the capacitance of the monitor capacitive element including the monitor electrode ME2 as a component decreases or a change in which the capacitance of the monitor capacitive element including the monitor electrode ME1 as a component decreases and the capacitance of the monitor capacitive element including the monitor electrode ME2 increases occurs. Therefore, the first analog voltage signal for monitor and the second analog voltage signal for monitor generated in the C/V conversion section CVU1 are different. The first digital voltage signal for monitor obtained by converting the first analog voltage signal for monitor in the A/D conversion section ADU1 and the second digital voltage signal for monitor obtained by converting the second analog voltage signal for monitor in the A/D conversion section ADU1 are also different. Therefore, when the weight M1 and the weight M2 are driven to vibrate (vibrate in opposite phases), the differential voltage signal for monitor proportional to the driving amplitude AX is output from the differential detection section DMU1.

The differential voltage signal for monitor output from the differential detection section DMU1 is converted (demodulated) from a signal having a carrier frequency into a signal having a driving frequency (e.g., several tens kilohertz) and further converted (demodulated) from the signal having the driving frequency into a signal having a low frequency (DC to several hundred hertz) in the synchronous detection section WDU1. The driving amplitude AX converted into the signal having the low frequency in this way is input to the AGC section AGC and compared with a target value set in advance. The magnitude of the driving voltage Vd (−Vd) is adjusted via the D/A conversion section DAU1 on the basis of a result of the comparison. In this way, it is possible to perform feedback control to adjust the driving amplitude AX to the target value set in advance.

The feedback control for keeping the driving amplitude AX constant is explained above. Further, in the first embodiment, the frequency (the driving frequency) of the driving voltage (Vd or −Vd) for driving to vibrate the weight M1 and the weight M2 is also controlled to be constant. For example, in order to obtain large driving amplitude AX with a small driving voltage, it is effective to cause the driving frequency of the driving voltage (Vd or −Vd) to resonate according to a peculiar number of vibrations of the driving vibration system configured by the weight M1, the weight M2, the link beam LB, and the supporting beam SB1. However, the peculiar number of vibrations of the driving vibration system is not always fixed and changes according to an ambient environment (temperature and pressure). Therefore, in the first embodiment, in order to cause the driving frequency to follow fluctuation in the peculiar number of vibrations of the driving vibration system due to fluctuation in the ambient environment, feedback control is performed using PLL (Phase Locked Loop). Specifically, AFC (Auto Frequency Control) is carried out by the AFC section AFC shown in FIG. 3.

In the first embodiment, as shown in FIG. 3, when the two weights M1 and M2 vibrate in opposite phases in the driving direction (the X direction), the monitor electrodes ME1 configuring the monitor capacitive elements, the capacitances of which change in the same direction (the increasing direction or the decreasing direction), are electrically connected to each other before the C/V conversion section CVU1. Similarly, when the two weights M1 and M2 vibrate in opposite phases in the driving direction (the X direction), the monitor electrodes ME2 configuring the monitor capacitive elements, the capacitances of which changes in the same direction (the increasing direction or the decreasing direction), are electrically connected before the C/V conversion section CVU1. Therefore, when the weight M1 and the weight M2 are vibrating in opposite phases, the capacitances of the monitor capacitive elements including the monitor electrodes ME1, which are electrically connected to each other, respectively as the components change in the same direction (the increasing direction or the decreasing direction). Similarly, when the weight M1 and the weight M2 are vibrating in opposite phases, the capacitances of the monitor capacitive elements including the monitor electrodes ME2, which are electrically connected to each other, respectively as the components change in the same direction (the decreasing direction or the increasing direction). When the capacitances of the monitor capacitive elements including the two monitor electrodes ME1, which are electrically connected to each other, respectively as the components increase, the capacitances of the monitor capacitive elements including the two monitor electrodes ME2, which are electrically connected to each other, respectively as the components decrease. On the other hand, when the capacitances of the monitor capacitive elements including the two monitor electrodes ME1, which are electrically connected to each other, respectively as the components decrease, the capacitances of the monitor capacitive elements including the two monitor electrodes ME2, which are electrically connected to each other, respectively as the components increase. Therefore, when the weight M1 and the weight M2 are vibrating in opposite phases, the differential voltage signal for monitor proportional to the vibration amplitude AX can be obtained in the differential detection section DMU1.

On the other hand, when the weight M1 and the weight M2 are vibrating in the same phase, the capacitance of one of the monitor capacitive elements including the two monitor electrodes ME1, which are electrically connected to each other, respectively as the components increases and the capacitance of the other decreases. Therefore, when the two monitor electrodes ME1 are electrically connected to each other, the increase in the capacitance and the decrease in the capacitance are combined. As a result, when the weight M1 and the weight M2 are vibrating in the same phase, the total capacitance obtained by combining the capacitances of the monitor capacitive elements including the two monitor electrodes ME1, which are electrically connected to each other, respectively as the components does not change. Similarly, when the weight M1 and the weight M2 are vibrating in the same phase, the capacitance of one of the monitor capacitive elements including the two monitor electrodes ME2, which are electrically connected to each other, respectively as the components increases and the capacitance of the other decreases. Therefore, when the two monitor electrodes ME2 are electrically connected to each other, the increase in the capacitance and the decrease in the capacitance are combined. As a result, when the weight M1 and the weight M2 are vibrating in the same phase, the total capacitance obtained by combining the capacitances of the monitor capacitive elements including the two monitor electrodes ME2, which are electrically connected to each other, respectively as the components does not change. Consequently, when the weight M1 and the weight M2 are vibrating in the same phase, the capacitance obtained by combining the capacitances of the monitor capacitive elements including the two monitor electrodes ME1, which are electrically connected to each other, respectively as the components and the capacitance obtained by combining the capacitances of the monitor capacitive elements including the two monitor electrodes ME2, which are electrically connected to each other, respectively as the components are equal. Therefore, the first analog voltage signal for monitor and the second analog voltage signal for monitor generated in the C/V conversion section CVU1 are equal. Therefore, the first digital voltage signal for monitor obtained by converting the first analog voltage signal for monitor in the A/D conversion section ADU1 and the second digital voltage signal for monitor obtained by converting the second analog voltage signal for monitor in the A/D conversion section ADU1 are also equal. Consequently, when the weight M1 and the weight M2 are vibrating in the same phase, the differential voltage signal for monitor generated in the differential detection section DMU1 is zero.

In this way, in the first embodiment, when the weight M1 and the weight M2 are vibrating in the same phase, the differential voltage signal for monitor output from the differential detection section DMU1 is zero. On the other hand, when the weight M1 and the weight M2 are vibrating in opposite phases, the differential voltage signal for monitor proportional to the vibration amplitude AX can be obtained in the differential detection section DMU1. That is, the monitor capacitive element not reacting to the same-phase vibration and having sensitivity to only the opposite-phase vibration can be configured. Therefore, there is an advantage that the monitor capacitive element is less easily affected by same-phase noise from the outside.

Further, in the first embodiment, for example, as shown in FIG. 3, the monitor capacitive element including the monitor electrode ME1 and the monitor electrode ME2 as the components is represented as a parallel plate type structure. However, the monitor capacitive element may be formed in a comb teeth type structure. By forming the monitor capacitive element in the comb teeth structure in this way, it is possible to suppress nonlinear (a ratio of a change in capacitance and driving amplitude) behavior that occurs in the parallel plate type structure.

Figure 4:
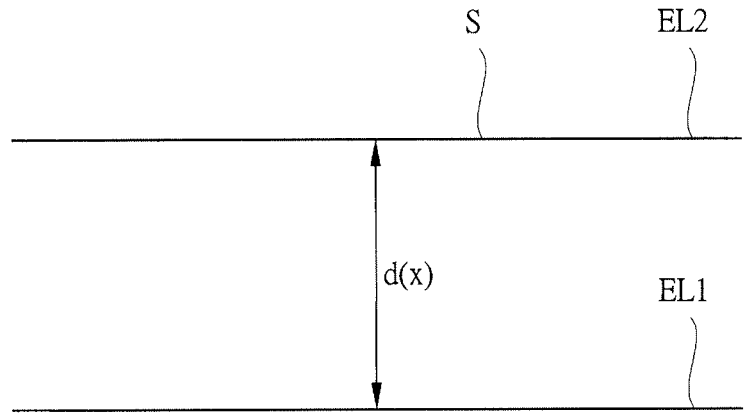
FIG. 4 is a schematic diagram showing a capacitive element of a parallel plate type structure.

FIG. 4 is a schematic diagram showing a capacitive element of the parallel plate type structure. In the capacitive element of the parallel plate type structure shown in FIG. 4, the distance between an electrode EL1 and an electrode EL2 is represented as $d(x)$ and the area of the electrode EL1 and the electrode EL2 is represented as S. In the capacitive element of the parallel plate type structure, the distance $d(x)$ between the electrode EL1 and the electrode EL2 changes, whereby capacitance changes. Specifically, the capacitance in the capacitive element of the parallel plate type structure is $C=\in S/d(x)$, where $\in$ represents a dielectric constant. In this case, since the variable $d(x)$ is present in the denominator, the change in the capacitance assumes a nonlinear shape.

Figure 5:
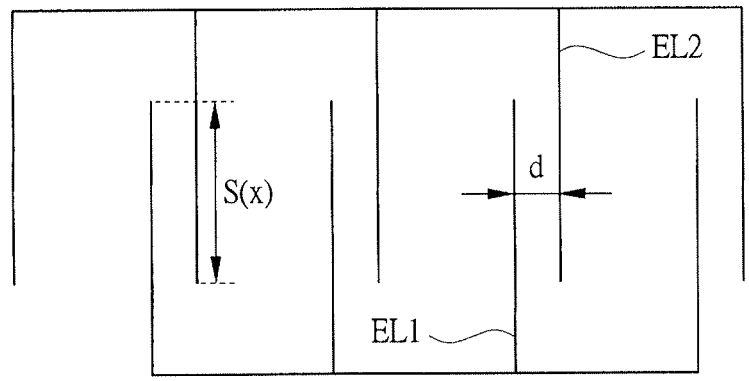
FIG. 5 is a schematic diagram showing a capacitive element of a comb teeth type structure.

On the other hand, FIG. 5 is a schematic diagram showing a capacitive element of the comb teeth type structure. In the capacitive element of the comb teeth type structure shown in FIG. 5, the distance between the electrode EL1 and the electrode EL2 is represented as d (fixed) and the area overlapping in plan view of the electrode EL1 and the electrode EL2 is represented as $S(x)$. In the capacitive element of the comb teeth structure, the area $S(x)$ overlapping in plan view of the electrode EL1 and the electrode EL2 changes, whereby capacitance changes. Specifically, the capacitance in the capacitive element in the comb teeth structure is $C=\in S(x)/d$, where $\in$ represents a dielectric constant. In this case, since the variable S(x) is present in the numerator, the change in the capacitance less easily assumes a nonlinear shape. Consequently, it is seen that, by forming the monitor capacitive element in the comb teeth type structure, it is possible to suppress nonlinear behavior that occurs in the parallel plate type structure.

It is assumed that, in a state in which the weight M1 and the weight M2 are vibrating in opposite phases, the angular velocity Ω is applied around the Y axis. In this case, when the angular velocity Ω is applied around the Y axis, in the weight M1 and the weight M2, the Coriolis force Fc indicated by Expression (1) is generated in the detecting direction (the Z direction). As it is seen from Expression (1) and Expression (2), when the Coriolis force Fc is generated, vibration (detection amplitude z) in the detecting direction (the Z direction) proportional to the applied angular velocity Ω occurs. At this point, since the weight M1 and the weight M2 are vibrating in opposite phases, the vibration in the detecting direction that occurs in the weight M1 and the weight M2 is also in opposite phases. When the vibration in the detecting direction occurs, the capacitance of the detection capacitive element formed by the weight M1 and the detection electrode DTE1 changes. Similarly, the capacitance of the detection capacitive element formed by the weight M2 and the detection electrode DTE2 also changes. The vibration in the detecting direction that occurs in the weight M1 and the vibration in the detecting direction that occurs in the weight M2 are in opposite phases. Therefore, when the capacitance of the detection capacitive element formed by the weight M1 and the detection electrode DTE1 changes in the increasing direction, the capacitance of the detection capacitive element formed by the weight M2 and the detection electrode DTE2 changes in the decreasing direction. Similarly, when the capacitance of the detection capacitive element formed by the weight M1 and the detection electrode DTE1 changes in the decreasing direction, the capacitance of the detection capacitive element formed by the weight M2 and the detection electrode DTE2 changes in the increasing direction.

Movements of charges are caused in the detection electrode DTE1 and the detection electrode DTE2 according to such a change in the capacitance of the detection capacitive element. According to the movement of the charges in the detection electrode DTE1, the first analog voltage signal for detection is generated in the C/V conversion section CVU2. Similarly, according to the movement of the charges in the detection electrode DTE2, the second analog voltage signal for detection is generated in the C/V conversion section CVU2. At this point, the change in the capacitance of the detection capacitive element formed by the weight M1 and the detection electrode DTE1 and the change in the capacitance of the detection capacitive element formed by the weight M2 and the detection electrode DTE2 are different as explained above. Therefore, the first analog voltage signal for detection and the second analog voltage signal for detection are different signals.

The first analog voltage signal for detection and the second analog voltage signal for detection generated in the C/V conversion section CVU2 are respectively converted into the first digital voltage signal for detection and the second digital voltage signal for detection in the A/D conversion section ADU2. Thereafter, the first digital voltage signal for detection and the second digital voltage signal for detection output from the A/D conversion section ADU2 are input to the differential detection section DMU2 and a difference between the first digital voltage signal for detection and the second digital voltage signal for detection is calculated. Specifically, the differential detection section DMU2 calculates a difference between the first digital voltage signal for detection and the second digital voltage signal for detection and outputs the differential voltage signal for detection.

The differential voltage signal for detection output from the differential detection section DMU2 is converted (demodulated) from a signal having a carrier frequency into a signal having a driving frequency (e.g., several tens kilohertz) and further converted (demodulated) from the signal having the driving frequency into a signal having a low frequency (DC to several hundred hertz) in the synchronous detection section WDU2. A high-frequency component of the signal having the low frequency converted in this way is removed in the low-pass filter LPF1. A signal corresponding to the angular velocity Ω is output. In this way, it is possible to detect the angular velocity Ω around the Y axis.

In the angular-velocity detecting section in the first embodiment, the peculiar number of vibrations of the driving vibration system configured by the weight M1, the weight M2, the link beam LB, and the supporting beam SB1 is designed to be equal to or higher than ten-odd kilohertz. The frequency of the driving vibration (the driving frequency) is adjusted to the peculiar number of vibrations of the driving vibration system. in the detection vibration system configured by the weight 1 and the supporting beam SB1 or the weight M2 and the supporting beam SB1, the peculiar number of vibrations of the detection vibration system is designed near the peculiar number of vibrations of the driving vibration system.

When sensitivity S of the angular-velocity detecting section in the first embodiment is defined as a ratio of the detection amplitude z and the input angular velocity Ω (S=z/Ω) and put in order using Expressions (1) to (4), Expression (5) is obtained.

$$Qz=(2\times\sqrt{(m \times kz)})/Cz \qquad (3)$$

where, Cz indicates a damping coefficient in the Z direction.

$$\omega z=\sqrt{(kz/m)} \qquad (4)$$

where, ωz is the peculiar number of vibrations of the detection vibration system. ωx (the peculiar number of vibrations of the driving oscillation system) and ωz (the peculiar number of vibrations of the detection vibration system) are substantially the same and the mass m of the weights is the same. Therefore, kx≈kz holds.

$$S=z/\Omega=2\times m\times AX/Cz \qquad (5)$$

It is seen from Expression (5) that the sensitivity S is a function of only the mass m of the weights, the driving amplitude AX, and the damping coefficient Cz in the Z direction and is unrelated to the peculiar number of vibrations ωx of the driving vibration system and the peculiar number of vibrations oz of the detection vibration system. Therefore, it is seen that it is possible to select the peculiar number of vibrations ωx of the driving vibration system and the peculiar number of vibrations oz of the detection vibration system without affecting the sensitivity S.

<Circuit Configurations for Detecting XY Direction Acceleration>

Figure 6:
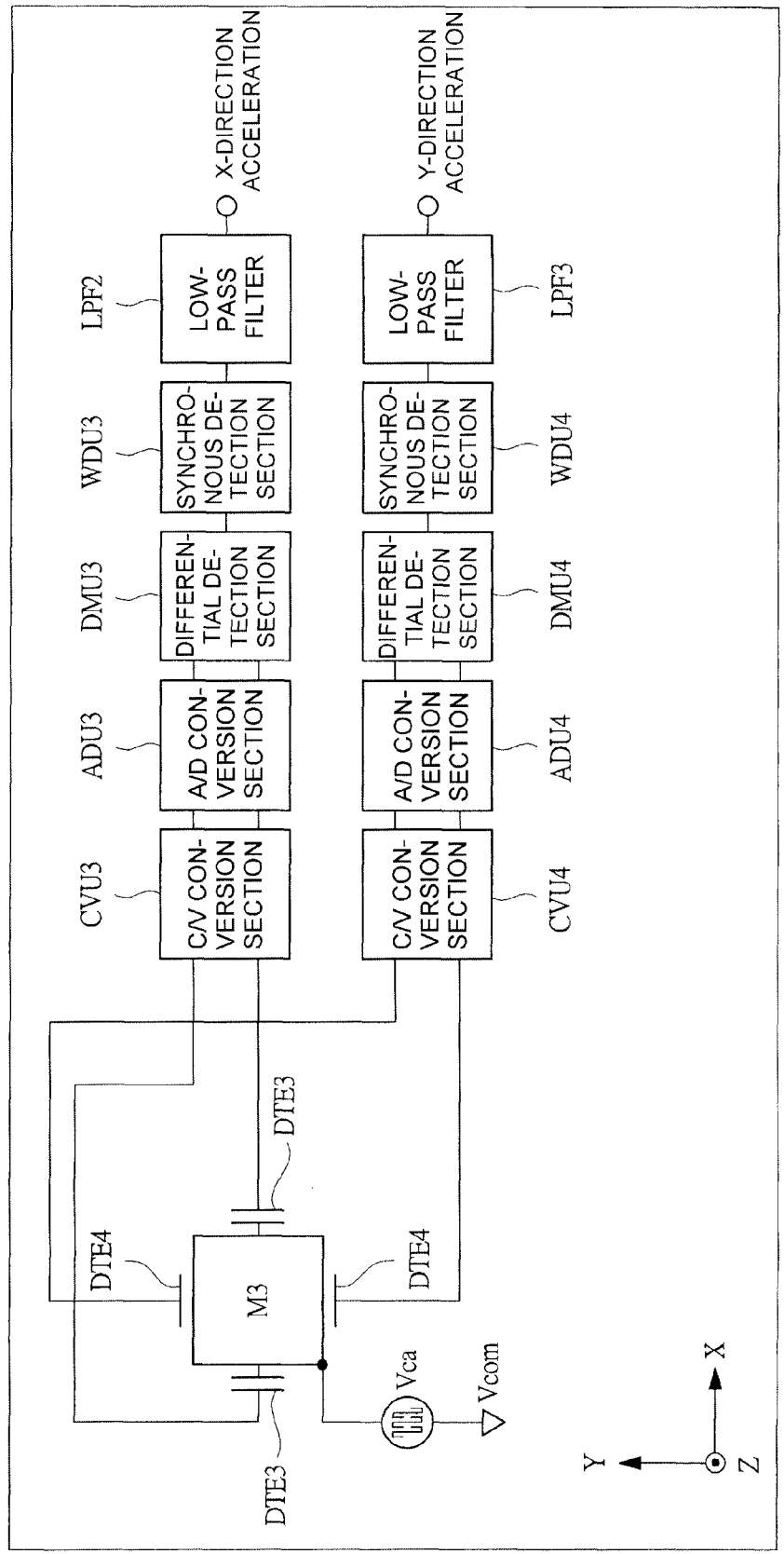
FIG. 6 is a block diagram showing circuit configurations for detecting acceleration using an XY-direction-acceleration detecting section.

Subsequently, circuit configurations for detecting acceleration in the X direction and acceleration in the Y direction using the XY-direction-acceleration detecting section are explained with reference to the drawings. FIG. 6 is a block diagram showing the circuit configurations for detecting acceleration using the XY-direction-acceleration detecting section.

First, a circuit configuration for detecting acceleration in the X direction is explained. As shown in FIG. 6, detection electrodes DTE3 are formed on both left and right sides of the weight M3. One detection capacitive element is formed by the weight M3 and the detection electrode DTE3 arranged on the left side of the weight M3. Similarly, another detection capacitive element is formed by the weight M3 and the detection electrode DTE3 arranged on the right side of the weight M3. Vcom and Vca are applied to the weight M3. Vcom indicates a common voltage. The common voltage (Vcom) is a direct-current voltage. On the other hand, Vca indicates a carrier voltage. The carrier voltage is an alternating-current voltage.

A C/V conversion section CVU3 is connected to the two detection electrodes DTE3 and configured to convert the capacitance of the detection capacitive element formed by one detection electrode DTE3 and the weight M3 into a first analog voltage signal for X-direction detection. Similarly, the C/V conversion section CVU3 is configured to convert the capacitance of the detection capacitive element formed by the other detection electrode DTE3 and the weight M3 into a second analog voltage signal for X-direction detection.

An A/D conversion section ADU3 is configured to receive the first analog voltage signal for X-direction detection output from the C/V conversion section CVU3 and convert the first analog voltage signal for X-direction detection into a first digital voltage signal for X-direction detection and receive the second analog voltage signal for detection output from the C/V detection section CVU3 and convert the second analog voltage signal for X-direction detection into a second digital voltage signal for X-direction detection.

A differential detection section DMU3 is configured to calculate a difference between the first digital voltage signal for X-direction detection and the second digital voltage signal for X-direction detection output from the A/D conversion section ADU3 and output a differential voltage signal for X-direction detection. A synchronous detection section WDU3 is configured to demodulate (down-convert) the differential voltage signal for X-direction detection and output a demodulated voltage signal for X-direction detection. Further, a low-pass filter LPF2 is configured to allow a signal having a frequency lower than a specific frequency to pass without attenuating the signal and attenuate and interrupt a signal having a frequency higher than the specific frequency.

A circuit configuration for detecting acceleration in the Y direction is explained. As shown in FIG. 6, a detection electrodes DTE4 are formed on both upper and lower sides of the weight M3. One detection capacitive element is formed by the weight M3 and the detection electrode DTE4 arranged on the upper side of the weight M3. Similarly, another detection capacitive element is formed by the weight M3 and the detection electrode DTE4 arranged on the lower side of the weight M3. Vcom and Vca is applied to the weight M3. Vcom indicates a common voltage. The common voltage (Vcom) is a direct-current voltage. On the other hand, Vca indicates a carrier voltage. The carrier voltage is an alternating-current voltage.

A C/V conversion section CVU4 is connected to the two detection electrodes DTE4 and configured to convert the capacitance of the detection capacitive element formed by one detection electrode DTE4 and the weight M3 into a first analog voltage signal for Y-direction detection. Similarly, the C/V conversion section CVU4 is configured to convert the capacitance of the detection capacitive element formed by the other detection electrode DTE4 and the weight M3 into a second analog voltage signal for Y-direction detection.

An A/D conversion section ADU4 is configured to receive the first analog voltage signal for Y-direction detection output from the C/V conversion section CVU4 and convert the first analog voltage signal for Y-direction detection into a first digital voltage signal for Y-direction detection and receive the second analog voltage signal for Y-direction detection output from the C/V conversion section CVU4 and convert the second analog voltage signal for Y-direction detection into a second digital voltage signal for Y-direction detection.

A differential detection section DMU4 is configured to calculate a difference between the first digital voltage signal for Y-direction detection and the second digital voltage signal for Y-direction detection output from the A/D conversion section ADU4 and output a differential voltage signal for Y-direction detection. The synchronous detection section WDU4 is configured to demodulate (down-convert) the differential voltage signal for Y-direction detection and output a demodulated voltage signal for Y-direction detection. Further, a low-pass filter LPF3 is configured to allow a signal having a frequency lower than a specific frequency to pass without attenuating the signal and attenuate and interrupt a signal having a frequency higher than the specific frequency.

<Operations for Detecting Acceleration in the XY Directions>

In the first embodiment, the circuit for detecting acceleration in the XY directions using the XY-direction-acceleration detecting section is configured as explained above. Operations for detecting acceleration in the XY directions using the circuit configured in this way are explained below with reference to FIG. 6.

First, an operation for detecting acceleration in the X direction is explained. In FIG. 6, the carrier voltage (Vca) of several hundred kilohertz is applied to the weight M3. The carrier voltage (Vca) causes movement of charges in the two detection electrodes DTE3 according to the capacitance of a detection capacitive element. According to the movement of the charges in one detection electrode DTE3, a first analog voltage signal for X-direction detection is generated in the C/V conversion section CVU3. Similarly, according to the movement of the charges in the other detection electrode DTE3, a second analog voltage signal for X-direction detection is generated in the C/V conversion section CVU3. The first analog voltage signal for X-direction detection and the second analog voltage signal for X-direction detection generated in the C/V conversion section CVU3 are respectively converted into a first digital voltage signal for X-direction detection and a second digital voltage signal for X-direction detection in the A/D conversion section ADU3. Thereafter, the first digital voltage signal for X-direction detection and the second digital voltage signal for X-direction detection output from the A/D conversion section ADU3 are input to the differential detection section DMU3 and a difference between the first digital voltage signal for X-direction detection and the second digital voltage signal for X-direction detection is calculated. Specifically, the differential detection section DMU3 calculates a difference between the first digital voltage signal for X-direction detection and the second digital voltage signal for X-direction detection and outputs a differential voltage signal for X-direction detection.

At this point, when acceleration in the X direction is not applied, only the carrier voltage (Vca) is applied to the weight M3. The carrier voltage (Vca) is a high-frequency voltage as high as several hundred kilohertz. Since the weight M3 cannot follow the carrier voltage (Vca), the weight M3 changes to a stationary state. In this case, the capacitance of the detection capacitive element by the one detection electrode DTE3 and the capacitance of the detection capacitive element by the other detection electrode DTE3 are equal. Therefore, the first analog voltage signal for X-direction detection and the second analog voltage signal for X-direction detection generated by the C/V conversion section CVU3 are equal. Therefore, the first digital voltage signal for X-direction detection obtained by converting the first analog voltage signal for X-direction detection in the A/D conversion section ADU3 and the second digital voltage signal for X-direction detection obtained by converting the second analog voltage signal for X-direction detection in the A/D conversion section ADU3 are also equal. Consequently, when acceleration is not applied in the X direction, the differential voltage signal for X-direction detection generated in the differential detection section DMU3 is zero.

On the other hand, for example, it is assumed that acceleration is applied in a +X direction. In this case, the weight M3 is displaced in the +X direction. Therefore, the capacitance of the detection capacitive element formed by the weight M3 and the detection electrode DTE3 arranged on the left side of the weight M3 decreases and the capacitance of the detection capacitive element formed by the weight M3 and the detection electrode DTE3 arranged on the right side of the weight M3 increases. Therefore, since the capacitance of the detection capacitive element formed by the weight M3 and the detection electrode DTE3 arranged on the left side of the weight M3 and the capacitance of the detection capacitive element formed by the weight M3 and the detection electrode DTE3 arranged on the right side of the weight M3 are different, the first analog voltage signal for X-direction detection and the second analog voltage signal for X-direction detection generated in the C/V conversion section CVU3 are different. The first digital voltage signal for X-direction detection obtained by converting the first analog voltage signal for X-direction detection in the A/D conversion section ADU3 and the second digital voltage signal for X-direction detection obtained by converting the second analog voltage signal for X-direction detection in the A/D conversion section ADU3 are also different. Therefore, for example, when acceleration is applied in the +X direction, the differential voltage signal for X-direction detection proportional to the magnitude of the acceleration is output from the differential detection section DMU3.

The differential voltage signal for X-direction detection output from the differential detection section DMU3 is converted (demodulated) from a signal having a carrier frequency into a signal having a driving frequency (e.g., several tends kilohertz) in the synchronous detection section WDU3 and further converted (demodulated) from the signal having the driving frequency into a signal having a low frequency (DC to several hundred hertz) (a demodulated voltage signal for X-direction detection). A high-frequency component of the signal having the low frequency converted in this way is removed by the low-pass filter LPF2. A signal corresponding to the acceleration in the X direction is output. In this way, it is possible to detect the acceleration in the X direction.

Subsequently, an operation for detecting acceleration in the Y direction is explained. In FIG. 6, the carrier signal (Vca) of several hundred kilohertz is applied to the weight M3. The carrier voltage (Vca) causes movement of charges in the two detection electrodes DTE4 according to the capacitance of a detection capacitive element. According to the movement of the charges in one detection electrode DTE4, a first analog voltage signal for Y-direction detection is generated in the C/V conversion section CVU4. Similarly, according to the movement of the charges in the other detection electrode DTE4, an analog voltage signal for Y-direction detection is generated in the C/V conversion section CVU4. The first analog voltage signal for Y-direction detection and the second analog voltage signal for Y-direction detection generated in the C/V conversion section CVU4 are respectively converted into a first digital voltage signal for Y-direction detection and a second digital voltage signal for Y-direction detection in the A/D conversion section ADU4. Thereafter, the first digital voltage signal for Y-direction detection and the second digital voltage signal for Y-direction detection output from the A/D conversion section ADU4 are input to the differential detection section DMU4 and a difference between the first digital voltage signal for Y-direction detection and the second digital voltage signal for Y-direction detection is calculated. Specifically, the differential detection section DMU4 calculates a difference between the first digital voltage signal for Y-direction detection and the second digital voltage signal for Y-direction detection and outputs a differential voltage signal in Y-direction detection.

At this point, when acceleration in the Y direction is not applied, only the carrier voltage (Vca) is applied to the weight M3. The carrier voltage (Vca) is a high-frequency voltage as high as several hundred kilohertz. Since the weight M3 cannot follow the carrier voltage (Vca), the weight M3 changes to a stationary state. In this case, the capacitance of the detection capacitive element by the one detection electrode DTE4 and the capacitance of the detection capacitive element by the other detection electrode DTE4 are equal. Therefore, the first analog voltage signal for Y-direction detection and the second analog voltage signal for Y-direction detection generated by the C/V conversion section CVU4 are equal. Therefore, the first digital voltage signal for Y-direction detection obtained by converting the first analog voltage signal for Y-direction detection in the A/D conversion section ADU4 and the second digital voltage signal for Y-direction detection obtained by converting the second analog voltage signal for Y-direction detection in the A/D conversion section ADU4 are also equal. Consequently, when acceleration is not applied in the Y direction, the differential voltage signal for Y-direction detection generated in the differential detection section DMU4 is zero.

On the other hand, for example, it is assumed that acceleration is applied in a +Y direction. In this case, the weight M3 is displaced in the +Y direction. Therefore, the capacitance of the detection capacitive element formed by the weight M3 and the detection electrode DTE4 arranged on the lower side of the weight M3 decreases and the capacitance of the detection capacitive element formed by the weight M3 and the detection electrode DTE4 arranged on the upper side of the weight M3 increases. Therefore, since the capacitance of the detection capacitive element formed by the weight M3 and the detection electrode DTE4 arranged on the lower side of the weight M3 and the capacitance of the detection capacitive element formed by the weight M3 and the detection electrode DTE4 arranged on the upper side of the weight M3 are different, the first analog voltage signal for Y-direction detection and the second analog voltage signal for Y-direction detection generated in the C/V conversion section CVU4 are different. The first digital voltage signal for Y-direction detection obtained by converting the first analog voltage signal for Y-direction detection in the A/D conversion section ADU4 and the second digital voltage signal for Y-direction detection obtained by converting the second analog voltage signal for Y-direction detection in the A/D conversion section ADU4 are also different. Therefore, for example, when acceleration is applied in the +Y direction, the differential voltage signal for Y-direction detection proportional to the magnitude of the acceleration is output from the differential detection section DMU4.

The differential voltage signal for Y-direction detection output from the differential detection section DMU4 is converted (demodulated) from a signal having a carrier frequency into a signal having a driving frequency (e.g., several tends kilohertz) in the synchronous detection section WDU4 and further converted (demodulated) from the signal having the driving frequency into a signal having a low frequency (DC to several hundred hertz) (a demodulated voltage signal for X-direction detection). A high-frequency component of the signal having the low frequency converted in this way is removed by the low-pass filter LPF3. A signal corresponding to the acceleration in the Y direction is output. In this way, it is possible to detect the acceleration in the Y direction.

Subsequently, a circuit configuration for detecting acceleration in the Z direction is explained. A technical idea in the first embodiment has a characteristic in the circuit configuration for detecting acceleration in the Z direction. In the following explanation, first, a general circuit configuration for detecting acceleration in the Z direction is explained and then a problem of this general technique is explained. Thereafter, a technical idea in the first embodiment contrived to solve the problem is explained.

<General Technique for Detecting Acceleration in the Z Direction>

Figure 7:
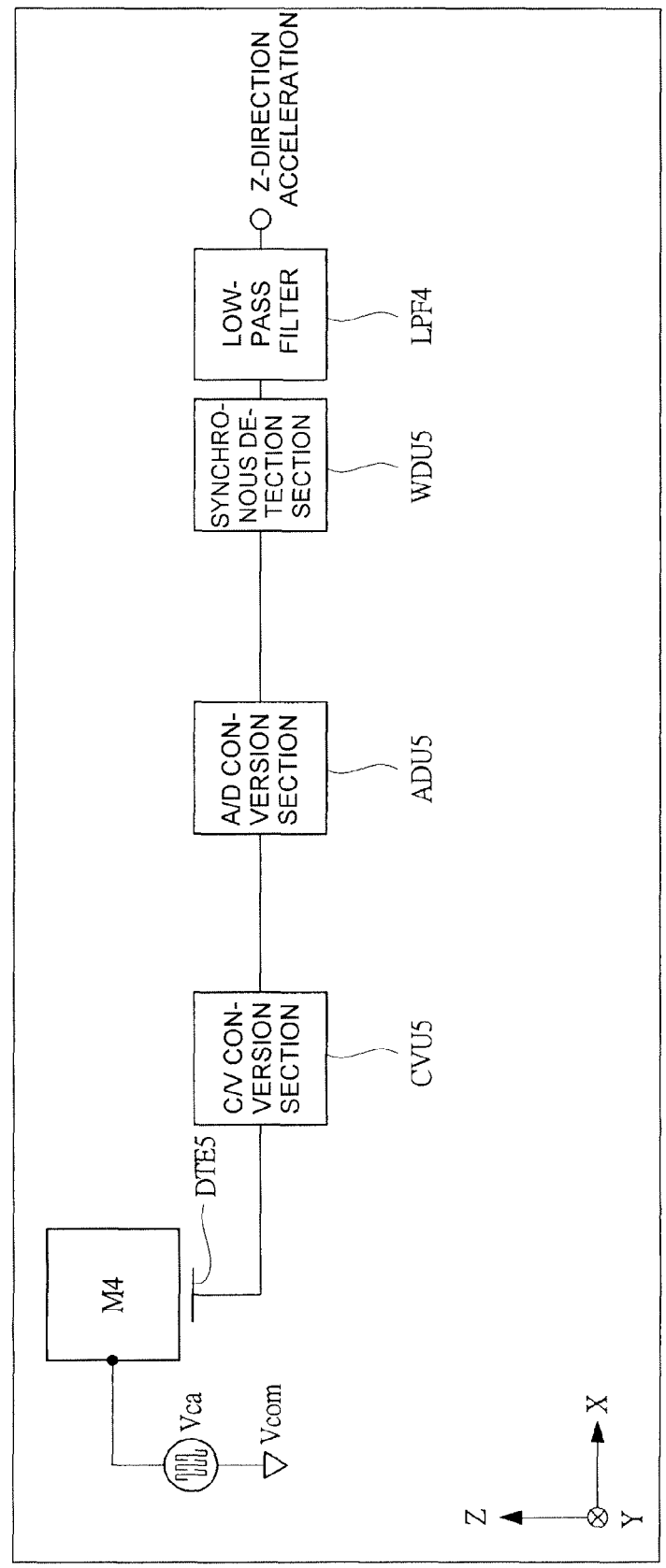
FIG. 7 is a circuit block diagram showing a general circuit configuration for detecting acceleration in a Z direction.

FIG. 7 is a circuit block diagram showing the general circuit configuration for detecting acceleration in the Z direction. In FIG. 7, a detection electrode DTE5 is formed on the lower side in the Z direction of the weight M4. One detection capacitive element is formed by the detection electrode DTE5 and the weight M4. Vcom and Vca are applied to the weight M4. Vcom indicates a common voltage. The common voltage (Vcom) is a direct-current voltage. On the other hand, Vca indicates a carrier voltage. The carrier voltage is an alternating-current voltage.

A C/V conversion section CVU5 is connected to the detection electrode DTE5 and configured to convert the capacitance of the detection capacitive element formed by the detection electrode DTE5 and the weight M4 into a first analog voltage signal for Z-direction detection.

An A/D conversion section ADU5 is configured to receive the first analog voltage signal for Z-direction detection output from the C/V conversion section CVU5 and convert the first analog voltage signal for Z-direction detection into a first digital voltage signal for Z-direction detection.

A synchronous detection section WDU5 is configured to demodulate (down-convert) the first digital voltage signal for Z-direction detection and output a demodulated voltage signal for X-direction detection. Further, a low-pass filter LPF4 is configured to allow a signal having a frequency lower than a specific frequency to pass without attenuating the signal and attenuate and interrupt a signal having a frequency higher than the specific frequency.

The general circuit for detecting acceleration in the Z direction is configured as explained above. In the following explanation, an operation for detecting acceleration in the Z direction using the circuit configured in this way is explained with reference to FIG. 7.

First, in FIG. 7, the carrier voltage (Vca) of several hundred kilohertz is applied to the weight M4. The carrier voltage (Vca) causes movement of charges in the detection electrode DTE5 according to the capacitance of a detection capacitive element. According to the movement of the charges in the detection electrode DTE5, a first analog voltage signal for Z-direction detection is generated in the C/V conversion section CVU5. The first analog voltage signal for Z-direction detection generated in the C/V conversion section CVU5 is converted into a first digital voltage signal for Z-direction detection in the A/D conversion section ADU5. Thereafter, the first digital voltage signal for Z-direction detection output from the A/D conversion section ADU5 is converted (demodulated) by the synchronous detection section WDU5 from a signal having a carrier frequency into a signal having a low frequency (DC to several hundred hertz) (a demodulated voltage signal for Z-direction detection). A high-frequency component of the signal having the low frequency converted in this way is removed in the low-pass filter LPF4. A signal corresponding to acceleration in the Z direction is output. For example, when acceleration is not applied in the Z direction, a signal corresponding to initial capacitance $C_0$ of the detection capacitive element formed by the weight M4 at rest and the detection electrode DTE5 is output. On the other hand, when acceleration is applied in a +Z direction, the weight M4 is displaced in the +Z direction. Therefore, the capacitance of the detection capacitive element formed by the weight M4 and the detection electrode DTE5 changes to $C_0-\Delta C$. A signal corresponding to the capacitance $(C_0-\Delta C)$ is output. As a result, it is possible to detect the acceleration applied in the +Z direction.

<Problem of the General Technique for Detecting Acceleration in the Z Direction>

However, in the general circuit configuration for detecting acceleration in the Z direction, only the detection capacitive element configured from the weight M4 and the detection electrode DTE5 is formed. Therefore, when the weight M4 is displaced in the +Z direction, the capacitance of the detection capacitive element configured from the weight M4 and the detection electrode DTE5 decreases. However, in the circuit explained above, a detection electrode corresponding to a detection capacitive element, the capacitance of which increases when the weight M4 is displaced in the +Z direction, is absent. That is, in the general circuit configuration, the circuit is not configured to form both of the detection capacitive element, the capacitance of which increases when the weight M4 is displaced, and the detection capacitive element, the capacitance of which decreases when the weight M4 is displaced, in the Z direction. This is because the Z direction is a stacking direction (the thickness direction) of a semiconductor substrate and, when acceleration is applied in an out-of-plane direction (the Z direction), it is difficult in a manufacturing process to form both of the detection capacitive element, the capacitance of which increases when the weight M4 is displaced, and the detection capacitive element, the capacitance of which decreases when the weight M4 is displaced. Therefore, as shown in FIG. 7, in the general circuit configuration for detecting acceleration in the Z direction, only the detection capacitive element configured from the weight M4 and the detection electrode DTE5 is formed. As shown in FIG. 7, a large first digital voltage signal for Z-direction detection corresponding to capacitance formed by $C_0$ (the initial capacitance) and $\pm\Delta C$ (a capacitance change caused by displacement) is directly input to the synchronous detection section WDU5. In this case, a problem occurs in that sensitivity for detecting acceleration in the Z direction is deteriorated.

For example, the initial capacitance of the detection capacitive element formed by the detection electrode DTE5 and the weight M4 is represented as $C_0=1$ pF, a capacitance change that occurs when maximum acceleration is applied in the Z direction is represented as $\Delta C=10$ fF, and the resolution of an acceleration sensor for detecting acceleration in the Z direction is represented as 1 fF. When a dynamic range of the acceleration sensor for detecting acceleration in the Z direction is defined as a ratio of the resolution of the acceleration sensor and a maximum signal amount input to the synchronous detection section WDU5, the dynamic range of the acceleration sensor is 1 fF/1000 fF(1 pF) and is 0.1%.

In general, high resolution and high sensitivity of the acceleration sensor can be realized when the dynamic range, which is an index of the high resolution and the high sensitivity of the acceleration sensor, is larger. Therefore, a contrivance for increasing the dynamic range is carried out. Specifically, the initial capacitance ($C_0$) is offset by performing differential detection using a reference capacitive element having capacitance having magnitude same as the magnitude of the initial capacitance of the detection capacitive element formed by the detection electrode DTE5 and the weight M4. According to this technique, a maximum signal input to the synchronous detection section WDU5 is a capacitance change ($\Delta C$ (=10 fF)) that occurs when maximum acceleration is applied. Since the resolution of the acceleration sensor is 1 fF, the dynamic range is 1 fF/10 fF and is 10%. Therefore, a dynamic range one hundred times as large as the dynamic range obtained when the reference capacitive element is not used can be obtained. Consequently, it is possible to substantially increase the dynamic range by performing the differential detection for offsetting the initial capacitance using the reference capacitive element. As a result, it is seen that it is possible to improve detection sensitivity of the acceleration sensor for detecting acceleration in the Z direction.

It is seen from the above that, in the acceleration sensor for detecting acceleration in the Z direction, in order to realize high sensitivity, it is desirable to carry out the differential detection using the reference capacitive element. However, when the reference capacitive element (a fixed capacitance element) that merely provides reference capacitance without having other functions is formed on a semiconductor chip, a reduction in size of the sensor and a reduction effect of manufacturing costs though an increase in the number of acquired chips per one semiconductor wafer are limited. That is, from the viewpoint of improving the sensitivity of the acceleration sensor for detecting acceleration in the Z direction, it is desirable to form the reference capacitive element on the semiconductor chip. However, the technique for merely forming the reference capacitive element having fixed capacitance on the semiconductor chip is not considered to be desirable from the viewpoint of a reduction in size of the sensor and a cost reduction.

Therefore, in the first embodiment, a contrivance is applied to the combined sensor that can detect a plurality of physical quantities such that it is possible to realize, while maintaining performance, a reduction in size and a cost reduction by increasing components that can be shared among sensors. A technical idea in the first embodiment to which the contrivance is applied is explained below.

<Circuit Configuration for Detecting Acceleration in the Z Direction in the First Embodiment>

Figure 8:
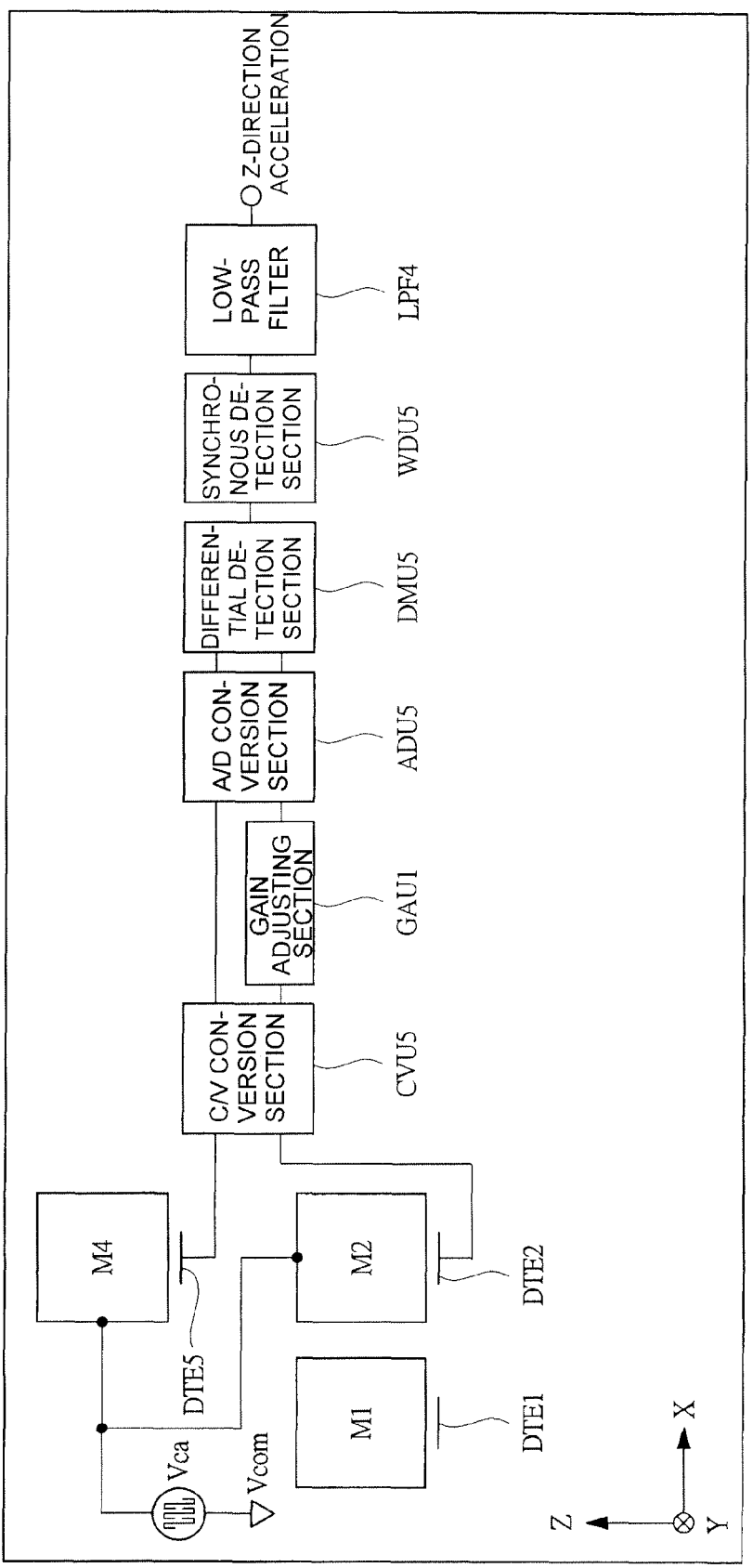
FIG. 8 is a circuit block diagram showing a circuit configuration for detecting acceleration in the Z direction in the first embodiment.

FIG. 8 is a circuit block diagram showing a circuit configuration for detecting acceleration in the Z direction in the first embodiment. In FIG. 8, the detection electrode DTE5 is formed on the lower side in the Z direction of the weight M4. One detection capacitive element is formed by the detection electrode DTE5 and the weight M4. Vcom and Vca are applied to the weight M4. Vcom indicates a common voltage. The common voltage (Vcom) is a direct-current voltage. On the other hand, Vca indicates a carrier voltage. The carrier voltage is the alternating-current voltage. The circuit is configured to apply the common voltage (Vcom) and the carrier voltage (Vca) to the weight M2 as well. The detection electrode DTE2 is arranged on the lower side in the Z direction of the weight M2. One reference capacitive element is formed by the detection electrode DTE2 and the weight M2. That is, the first embodiment has a characteristic in that the weight M2 and the detection electrode DTE2 used in the angular-velocity detecting section are also used as the reference capacitive element of a Z-direction-acceleration detection section configured to detect acceleration in the Z direction. That is, a characteristic of the Z-direction-acceleration detecting section in the first embodiment is that the detection capacitive element formed by the weight M2 and the detection electrode DTE2 configuring the angular-velocity detecting section is used as the reference capacitive element for the detection capacitive element formed by the detection electrode DTE5 and the weight M4. Since the detection capacitive element formed by the weight M2 and the detection electrode DTE2 configuring the angular-velocity detecting section is used as the reference capacitive element of the Z-direction-acceleration detecting section in this way, the reference capacitive element (the fixed capacitance element) formed for only providing reference capacitance without having other functions is unnecessary. Therefore, it is possible to realize a reduction in size of a combined sensor including the angular-velocity detecting section and the Z-direction-acceleration detecting section.

The C/V conversion section CVU5 is connected to the detection electrode DTE2 and the detection electrode DTE5 and configured to convert the capacitance of the detection capacitive element formed by the detection electrode DTE5 and the weight M4 into a first analog voltage signal for Z-direction detection. Similarly, the C/V conversion section CVU5 is configured to convert the capacitance of the reference capacitive element formed by the detection electrode DTE2 and the weight M2 into a second analog voltage signal for Z-direction reference.

A gain adjusting section GAU1 is configured to adjust the magnitude (the gain) of the second analog voltage signal for Z-direction reference output from the C/V conversion section CVU5.

Further, the A/D conversion section ADU5 is configured to receive the first analog voltage signal for Z-direction detection output from the C/V conversion section CVU5 and convert the first analog voltage signal for Z-direction detection into a first digital voltage signal for Z-direction detection and receive the second analog voltage signal for Z-direction reference output from the gain adjusting section GAU1 and convert the second analog voltage signal for Z-direction reference into a second digital voltage signal for Z-direction reference.

A differential detection section DMU5 is configured to calculate a difference between the first digital voltage signal for Z-direction detection and the second digital voltage signal for Z-direction reference output from the A/D conversion section ADU5 and output a differential voltage signal for Z-direction detection. The synchronous detection section WDU5 is configured to demodulate (down-convert) the differential voltage signal for Z-direction detection and output a demodulated voltage signal for Z-direction detection. Further, the low-pass filter LPF4 is configured to allow a signal having a frequency lower than a specific frequency to pass without attenuating the signal and attenuate and interrupt a signal having a frequency higher than the specific frequency.

A reason for providing the gain adjusting section GAU1 and adjusting the magnitude of the second analog voltage signal for Z-direction reference in the first embodiment is explained. For example, in the Z-direction-acceleration detecting section in the first embodiment, the detection capacitive element configured by the weight M4 and the detection electrode DTE5 is used and the weight M2 and the detection electrode DTE2 configuring the angular-velocity detecting section are used as the reference capacitive element as well. Therefore, it is considered normal that, since the reference capacitive element formed by the weight M2 and the detection electrode DTE2 and the detection capacitive element formed by the weight M4 and the detection electrode DTE5 are originally components belonging to different detecting sections (the Z-direction-acceleration detecting section and the angular-velocity detecting section), the detection capacitive element and the reference capacitive element have different shapes (areas and distances among elements). This means that the initial capacitance of the detection capacitive element configured from the weight M4 and the detection electrode DTE5 and the reference capacitance of the reference capacitive element configured from the weight M2 and the detection electrode DTE2 are different. Consequently, for example, even when acceleration is not applied in the Z direction, the magnitude of the first analog voltage signal for Z-direction detection obtained by converting the initial capacitance of the detection capacitive element in the C/V conversion section CVU5 and the second analog voltage signal for Z-direction reference obtained by converting the reference capacitance of the reference capacitive element in the C/V conversion section CVU5 are different. The differential voltage signal for Z-direction detection output from the differential detection section DMU5 is not zero. However, for the acceleration sensor, when acceleration is not applied in the Z direction, it is desirable that the differential voltage signal for Z-direction detection output from the differential detection section DMU5 is zero. Therefore, in the first embodiment, the gain adjusting section GAU1 configured to adjust the magnitude (the gain) of the second analog voltage signal for Z-direction reference is provided, whereby the circuit is configured such that the differential voltage signal for Z direction-detection output from the differential detection section DMU5 is zero when acceleration is not applied in the Z direction. That is, in the first embodiment, the gain adjusting section GAU1 is provided to adjust a zero offset due to a difference between the initial capacitance of the detection capacitive element configured from the weight M4 and the detection electrode DTE5 and the reference capacitance of the reference capacitive element configured from the weight M2 and the detection electrode DTE2. In the first embodiment shown in FIG. 8, the gain adjusting section GAU1 is configured to adjust the magnitude of the second analog voltage signal for Z-direction reference. However, for example, the gain adjusting section GAU1 may be provided to adjust the first analog voltage signal in the Z-direction detection.

As explained above, a characteristic of the Z-direction-acceleration detecting section in the first embodiment is that the detection capacitive element formed by the weight M2 and the detection electrode DTE2 configuring the angular-velocity detecting section is used as the reference capacitive element for the detection capacitive element formed by the detection electrode DTE5 and the weight M4. From this viewpoint, the technical idea in the first embodiment includes (a) a first detecting section configured to grasp application of a first physical quantity (acceleration) as a change in the capacitance of the first detection capacitive element and (b) a second detecting section configured to grasp application of a second physical quantity (an angular velocity) as a change in the capacitance of the second detection capacitive element. The combined sensor has a characteristic that the first physical quantity is detected on the basis of a difference between a detection signal obtained by converting the capacitance of the first detection capacitive element output from the first detecting section and a reference signal obtained by converting the capacitance of the second detection capacitive element output from the second detecting section.

<Operation for Detecting Acceleration in the Z Direction>

In the first embodiment, the circuit for detecting acceleration in the Z direction using the Z-direction-acceleration detecting section is configured as explained above. An operation for detecting acceleration in the Z direction using the circuit configured in this way is explained below with reference to FIG. 8.

First, in FIG. 8, the carrier voltage (Vca) of several hundred kilohertz is applied to the weight M4 and the weight M2. The carrier (Vca) causes movement of charges in the detection electrode DTE2 and the detection electrode DTE5 according to the capacitance of a detection capacitive element and the capacitance of a reference capacitive element. According to the movement of the charges in the detection electrode DTE5, a first analog voltage signal for Z-direction detection is generated in the C/V conversion section CVU5. Similarly, according to the movement of the charges in the detection electrode DTE2, a second analog voltage signal for Z-direction reference is generated in the C/V conversion section CVU5. The second analog voltage signal for Z-direction reference output from the C/V conversion section CVU5 is input to the gain adjusting section GAU1. The magnitude of the second analog voltage signal for Z-direction reference is adjusted. Thereafter, the first analog voltage signal for Z-direction detection generated in the C/V conversion section CVU5 and the second analog voltage signal for Z-direction reference, the magnitude of which is adjusted in the gain adjusting section GAU1, are respectively converted into a first digital voltage signal for Z-direction detection and a second digital voltage signal for Z-direction reference in the A/D conversion section ADU5. Thereafter, the first digital voltage signal for Z-direction detection and the second digital voltage signal for Z-direction reference output from the A/D conversion section ADU5 are input to the differential detection section DMU5 and a difference between the first digital voltage signal for Z-direction detection and the second digital voltage signal for Z-direction reference is calculated. Specifically, the differential detection section DMU5 calculates a difference between the first digital voltage signal for Z-direction detection and the second digital voltage signal for Z-direction reference and outputs a differential voltage signal for Z-direction detection.

At this point, when acceleration in the Z direction is not applied, only the carrier voltage (Vca) is applied to the weight M4 and the weight M2. The carrier voltage (Vca) is a high-frequency voltage as high as several hundred kilohertz. Since the weight M4 and the weight M2 cannot follow the carrier voltage (Vca), the weight M4 and the weight M2 changes to a stationary state. In this case, the first analog voltage signal for Z-direction detection generated in the C/V conversion section CVU5 and the second analog voltage signal for Z-direction reference, the magnitude of which is adjusted in the gain adjusting section GAU1, are equal. Therefore, the first digital voltage signal for Z-direction detection obtained by converting the first analog voltage signal for Z-direction detection in the A/D conversion section ADU5 and the second digital voltage signal for Z-direction reference obtained by converting the second analog voltage signal for Z-direction reference in the A/D conversion section ADU5 are also equal. Consequently, when acceleration is not applied in the Z direction, the differential voltage signal for Z-direction detection generated in the differential detection section DMU5 is zero.

On the other hand, for example, it is assumed that acceleration is applied in a +Z direction. In this case, the weight M4 is displaced in the +Z direction. Therefore, the capacitance of the detection capacitive element formed by the detection electrode DTE5 and the weight M4 decreases and, on the other hand, the reference capacitance of the reference capacitive element formed by the detection electrode DTE2 and the weight M2 hardly changes. Therefore, since the capacitance of the detection capacitive element formed by the detection electrode DTE5 and the weight M4 and the reference capacitance of the reference capacitive element formed by the detection electrode DTE2 and the weight M2 are different, the first analog voltage signal for Z-direction detection generated in the C/V conversion section CVU5 and the second analog voltage signal for Z-direction reference output from the gain adjusting section GAU1 are different. The first digital voltage signal for Z-direction detection obtained by converting the first analog voltage signal for Z-direction detection in the A/D conversion section ADU5 and the second digital voltage signal for Z-direction reference obtained by converting the second analog voltage signal for Z-direction reference in the A/D conversion section ADU5 are also different. Therefore, for example, when acceleration is applied in the +Z direction, the differential voltage signal for Z-direction detection proportional to the magnitude of the acceleration is output from the differential detection section DMU5.

The differential voltage signal for Z-direction detection output from the differential detection section DMU5 is converted (demodulated) from a signal having a carrier frequency into a signal having a low frequency (DC to several hundred hertz) (a demodulated voltage signal for Z-direction detection) in the synchronous detection section WDU5. A high-frequency component of the signal having the low frequency converted in this way is removed by the low-pass filter LPF4. A signal corresponding to the acceleration in the Z direction is output. In this way, it is possible to detect the acceleration in the Z direction.

According to the first embodiment, even when acceleration in the Z direction (the thickens direction of a semiconductor substrate) is detected, the differential detection is performed using not only one detection capacitive element but also the reference capacitive element. Therefore, compared with the general technique shown in FIG. 7, it is possible to realize an acceleration sensor having high sensitivity. In the Z-direction-acceleration detecting section in the first embodiment, the detection capacitive element formed by the weight M2 and the detection electrode DTE2 configuring the angular-velocity detecting section is used as the reference capacitive element for the detection capacitive element formed by the detection electrode DTE5 and the weight M4. Since the detection capacitive element formed by the weight M2 and the detection electrode DTE2 configuring the angular-velocity detecting section is used as the reference capacitive element of the Z-direction-acceleration detecting section in this way, the reference capacitive element (the fixed capacitance element) formed for only providing reference capacitance without having other functions is unnecessary. Therefore, it is possible to realize a reduction in size of a combined sensor including the angular-velocity detecting section and the Z-direction-acceleration detecting section. That is, in the first embodiment, it is possible to realize high-sensitivity sensing by using, for detection of acceleration in the Z direction, the differential detection performed using the reference capacitive element. Further, since the detection capacitive element formed by the weight M2 and the detection electrode DTE2 configuring the angular-velocity detecting section is used as the reference capacitive element, a space for forming the reference capacitive element (the fixed capacitance element) formed for only providing reference capacitance without having other functions is unnecessary. Therefore, it is possible to obtain a remarkable effect that it is possible to attain a reduction in size of a combined sensor including the angular-velocity detecting section and the Z-direction-acceleration detecting section.

<Reason why the Detection Capacitive Element of the Angular-Velocity Detecting Section can be Used as the Reference Capacitive Element>

Figure 9:
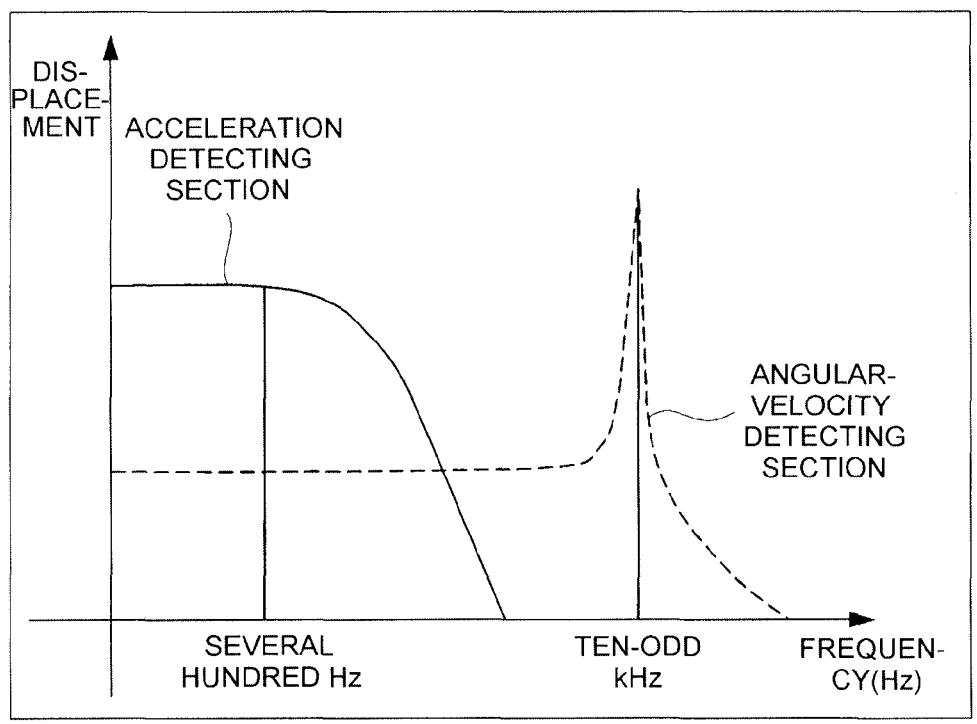
FIG. 9 is a graph showing a frequency characteristic in a detection vibration system in the angular-velocity detecting section and a frequency characteristic of a Z-direction-acceleration detecting section.

Subsequently, a reason why the detection capacitive element of the angular-velocity detecting section can be used as the reference capacitive element of the Z-direction-acceleration detecting section is explained. FIG. 9 is a graph showing a frequency characteristic in the detection vibration system of the angular-velocity detecting section and a frequency characteristic of the Z-direction-acceleration detecting section. In FIG. 9, the abscissa indicates a frequency (Hz) and the ordinate indicates displacement. As shown in FIG. 9, it is seen that the frequency characteristic of the detection vibration system of the angular-velocity detecting section is a frequency characteristic having a resonance peak at ten-odd kilohertz. On the other hand, it is seen that the frequency characteristic of the Z-direction-acceleration detecting section is a frequency characteristic not having a resonance peak and having sensitivity at several hundred hertz.

As it is seen from above Expression (3) and Expression (5), in order to obtain large driving amplitude Ax for the purpose of increasing sensitivity, the angular-velocity detecting section is desired to set a mechanical quality coefficient (Qz) high by performing vacuum hermetic sealing. On the other hand, since there are a large number of requests for measuring low-frequency vibration such as gravity and inclination, the Z-direction-acceleration detecting section is designed to reduce a peculiar number of vibrations as much as possible, increase damping, and not have a resonance peak. Further, in the Z-direction acceleration sensor, an unnecessary high-frequency signal is processed using a low-pass filter not to be output.

The Z-direction-acceleration detecting section is configured such that the weight M4 is displaced in the Z direction by input acceleration. A relation between the displacement ($z_0$) and the input acceleration (a) is as indicated by Expression (6).

$$z_0 = a/\omega_0^2$$

$$\omega_0 = \sqrt{(k/m)} \quad (6)$$

It is seen from Expression (6) that the displacement $z_0$ is a function of the peculiar number of vibrations $\omega_0$ of the detection vibration system determined by the mass m of the weight M4 and a spring constant k of the supporting beam SB3. Therefore, when the peculiar number of vibrations of the reference capacitive element is represented as $\omega 1$, a differential displacement $\Delta z$ can be defined as indicated by Expression (7).

$$\Delta z = z_0 - z_1 = a \times (1/\omega_0^2 - 1/\omega_1^2) \quad (7)$$

When the peculiar number of vibrations $\omega 1$ of the reference capacitive element is represented as $\alpha \times \omega_0$, Expression (7) is converted into Expression (8).

$$\Delta z = z_0 - z_1 = a/\omega_0^2 \times (1 - 1/\alpha^2) \quad (8)$$

In Expression (8), when a fixed capacitance element is used as the reference capacitive element, $\alpha$ is infinite and $\Delta z = z_0$. On the other hand, when $\alpha=1$, that is, a reference capacitive element having a peculiar number of vibrations same as the peculiar number of vibrations of the detection vibration system of the Z-direction-acceleration detecting section is used, $\Delta z=0$. It is seen that an output of the Z-direction acceleration sensor cannot be obtained. That is, to attain a sufficient function of the reference capacitive element, it is necessary to use a reference capacitive element having a peculiar number of vibrations sufficiently larger than the peculiar number of vibrations $\omega_0$ of the detection vibration system of the Z-direction-acceleration detecting section.

In the combined sensor in the first embodiment, the peculiar number of vibrations of the detection vibration system in the angular-velocity detecting section is set to several tens kilohertz (e.g., 10 to 30 kHz). On the other hand, the peculiar number of vibrations of the detection vibration system in the Z-direction-acceleration detecting section is designed to be, for example, 1 to 3 kHz. Therefore, when the peculiar number of vibrations of the detection vibration system in the Z-direction-acceleration detecting section is represented as $\omega_0$ and the detection vibration system in the angular-velocity detecting section is used as the reference capacitive element of the Z-direction-acceleration detecting section, a ratio $\alpha$ of the peculiar number of vibrations ($\omega_0$) of the detection vibration system in the Z-direction-acceleration detecting section and the peculiar number of vibrations ($\omega_1$) of the reference capacitive element is a value equal to or larger than 10. The differential displacement $\Delta z$ is a value equal to or larger than 99% of the displacement $z_0$. That is, in the first embodiment, the peculiar number of vibrations ($\omega_1$) of the detection vibration system in the angular-velocity detecting section is set larger than the peculiar number of vibrations ($\omega_0$) of the detection vibration system in the Z-direction-acceleration detecting section. Consequently, when the detection vibration system in the angular-velocity detecting section is used as the reference capacitive element of the Z-direction-acceleration detecting section, it is possible to obtain the differential displacement $\Delta z$ substantially equivalent to the differential displacement $\Delta z$ obtained when the fixed capacitance element, the capacitance of which is fixed, as the reference capacitive element. In terms of the motion of the Z-direction-acceleration detecting section, this means that, by using the detection vibration system as the reference capacitive element in the angular-velocity detecting section that can be considered as being relatively stopped, it is possible to obtain a high-performance and small combined sensor even if the fixed capacitance element is not used. Consequently, it is seen that the detection capacitive element of the angular-velocity detecting section can be used as the reference capacitive element of the Z-direction-acceleration detecting section.

As explained with reference to Expression (5), an important point is that, because the peculiar number of vibrations of the angular-velocity detecting section does not have a correlation with the sensitivity of the angular-velocity detecting section, it is possible to arbitrarily select the peculiar number of vibrations of the angular-velocity detecting section without deteriorating the sensitivity of the angular-velocity detecting section. Consequently, since the detection vibration system in the angular-velocity detecting section is used as the reference capacitive element of the Z-direction-acceleration detecting section, it is possible to set the peculiar number of vibrations of the detection vibration system in the angular-velocity detecting section to a peculiar number of vibrations larger than the peculiar number of vibrations of the detection vibration system in the Z-direction acceleration detecting section. Further, as a secondary effect of this configuration, by setting the peculiar number of vibrations of the detection vibration system in the angular-velocity detecting section to a high frequency, since the angular-velocity detecting section becomes insensitive to vibration disturbance of a low frequency, it is possible to realize the angular-velocity detecting section having high reliability.

In this way, in a low-frequency domain within a response range of the Z-direction-acceleration detecting section, the detection capacitive element of the angular-velocity detecting section, which can be relatively regarded as a fixed capacitor, can be used as the reference capacitive element. However, in vibration at ten-odd kilohertz including the peculiar number of vibrations of the detection vibration system in the angular-velocity detecting section, the Z-direction-acceleration detecting section hardly reacts and is in a stationary state. However, since the angular-velocity detecting section has a resonance peak, a capacitance change occurs in the detection capacitive element of the angular-velocity detecting section used as the reference capacitive element. The capacitance change is input to the C/V conversion section CVU 5 shown in FIG. 8. Thereafter, the capacitance change passes through the synchronous detection section WDU5 and is cut in the low-pass filter LPF4. Therefore, since the capacitance change is cut in the low-pass filter LPF4, the capacitance change does not appear as an output of the Z-direction-acceleration detecting section. However, depending on the magnitude of input high-frequency vibration of ten-odd kilohertz, the capacitance change is likely to cause saturation or zero shift of the A/D conversion section arranged before the low-pass filter LPF4. Therefore, it is likely that the function of the Z-direction-acceleration detecting section is lost.

In this way, when high-frequency noise due to the peculiar number of vibrations (high-frequency vibration of ten-odd kilohertz) of the angular-velocity detecting section occurs, the frequency of a voltage signal input to the synchronous detection section WDU5 shown in FIG. 8 is (frequency of the carrier voltage (Vca))±(peculiar number of vibrations of the detection vibration system in the angular-velocity detecting section). Therefore, a signal pass bad (a frequency characteristic) from the C/V conversion section CVU5 to the synchronous detection section WDU5 is set lager than a value obtained by subtracting the peculiar number of vibrations of the detection vibration system in the angular-velocity detecting section from the frequency of a carrier wave (the frequency of the carrier voltage (Vca)) and smaller than a value obtained by adding up the frequency of the carrier wave and the peculiar number of vibrations of the detection vibration system in the angular-velocity detecting section. Consequently, even if vibration disturbance occurs around the peculiar number of vibrations of the detection vibration system in the angular-velocity detecting section, high-frequency noise is reduced during signal processing and stable acceleration in a low-frequency domain can be detected. That is, since the components from the C/V conversion section CVU5 to the synchronous detection section WDU5 have the frequency characteristic explained above, it is possible to prevent occurrence of saturation and zero shift of the A/D conversion section. As a result, it is possible to maintain the function of the Z-direction-acceleration detecting section normal.

Figure 10:
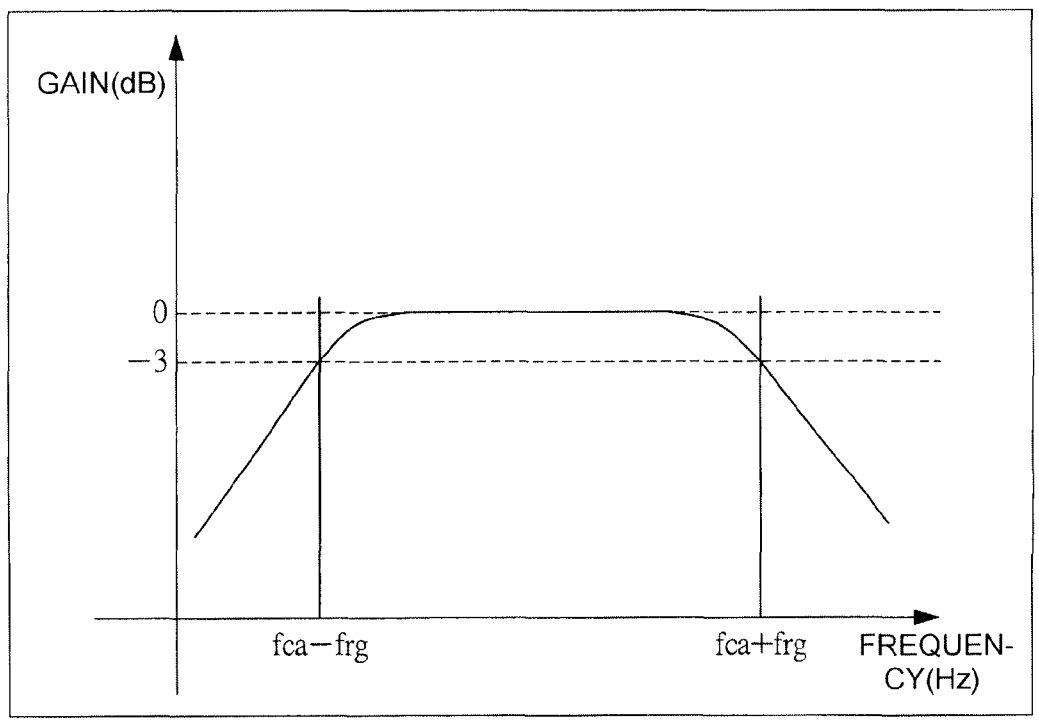
FIG. 10 is a graph showing a bandwidth filter characteristic from a C/V conversion section to a synchronous detection section.

FIG. 10 is a graph showing a bandwidth filter characteristic from the C/V conversion section CVU5 to the synchronous detection section WDU5. In FIG. 10, the abscissa indicates a frequency (Hz) and the ordinate indicates the magnitude (the gain) of a passing signal. As shown in FIG. 10, it is seen that the bandwidth filter characteristic from the C/V conversion section CVU5 to the synchronous detection section WDU5 is larger than a value obtained by subtracting a peculiar number of vibrations (frg) of the detection vibration system in the angular-velocity detecting section from a carrier wave frequency (fca) and smaller than a value obtained by adding up the carrier wave frequency (fca) and the peculiar number of vibrations (frg) of the detection vibration system in the angular-velocity detecting section. A signal pass band includes signals from a signal passing at the magnitude (0 dB) of the original signal to a signal passing while being attenuated to a half magnitude (−3 dB).

Modification of the First Embodiment

In the first embodiment, an example in which the detection capacitive element of the angular-velocity detecting section is used as the reference capacitive element of the Z-direction-acceleration detecting section is explained. However, when a capacitive element formed between the weight M3 of the XY-direction-acceleration detecting section and the semiconductor substrate is used as the reference capacitive element, effects same as the effects in the first embodiment can be obtained. In particular, since the weight M3 of the XY-direction-acceleration detecting section is less easily displaced in the Z direction, when the capacitive element formed between the weight M3 of the XY-direction-acceleration detecting section and the semiconductor substrate is used as the reference capacitive element, an advantage that the reference capacitive element is a perfect fixed capacitance element is obtained. The combined sensor that can detect an angular velocity of one axis (the Y direction) and accelerations of three axes (XYZ directions) is explained as an example of the combined sensor in the first embodiment. However, the technical idea of the first embodiment can also be applied to a combined sensor that can detect only accelerations of the three axes.

<Method of Manufacturing the Combined Sensor in the First Embodiment>

The combined sensor in the first embodiment is configured as explained above. A method of manufacturing the combined sensor is explained below with reference to the drawings. Specifically, in the first embodiment, the method of manufacturing the combined sensor is explained using a sectional view taken along line A-A in FIG. 1.

Figure 11:
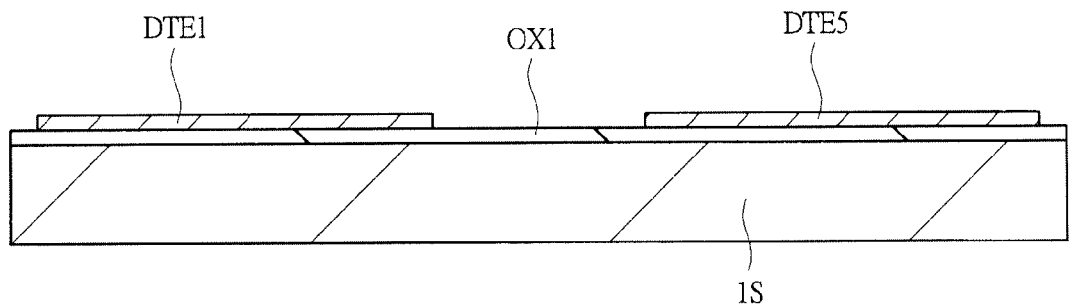
FIG. 11 is a sectional view showing a manufacturing process for the combined sensor in the first embodiment.

As shown in FIG. 11, the semiconductor substrate 1S on which the insulating film OX1 made of, for example, a silicon oxide film having thickness of about 1 μm is formed is prepared. The thickness of the semiconductor substrate 1S is, for example, about several hundred μm. First, as shown in FIG. 11, for example, a polysilicon film (a polycrystalline silicon film) having thickness of about 1 μm is formed on the insulating film OX1. Wiring layers such as the detection electrode DTE1 and the detection electrode DTE5 are formed by patterning the polysilicon film. In the first embodiment, the wiring layers such as the detection electrode DTE1 and the detection electrode DTE5 are formed from the polysilicon film. However, conductive films made of metal such as aluminum (Al), titanium tungsten (TiW), and tungsten silicide (WSi) can also be used.

Figure 12:
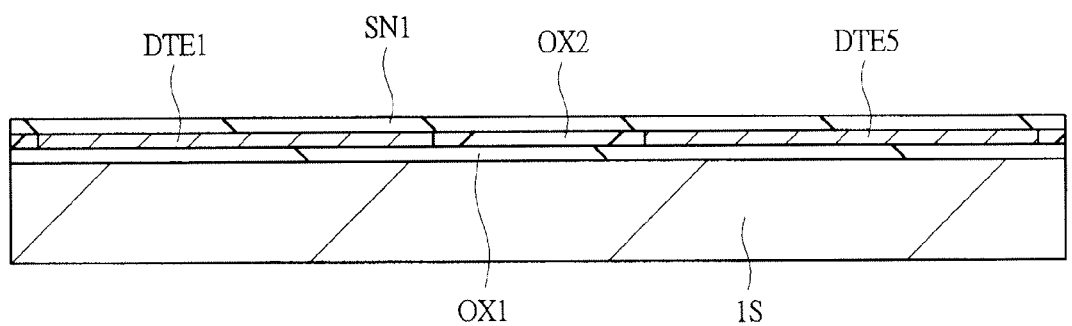
FIG. 12 is a sectional view showing the manufacturing process for the combined sensor following FIG. 11.

Subsequently, as shown in FIG. 12, the insulating film OX2 made of a silicon oxide film (TEOS (Tetra Ethyl Ortho Silicate) film) is formed to cover the detection electrode DTE1 and the detection electrode DTE5. The insulating film OX2 can be formed by, for example, a CVD (Chemical Vapor Deposition) method. Thereafter, the insulating film OX2 is polished using a CMP (Chemical Mechanical Polishing) method until the detection electrode DTE1 and the detection electrode DTE5 are exposed. Subsequently, the insulating film SN1 made of a silicon nitride film is formed on the insulating film OX2 including the exposed detection electrodes DTE1 and DTE5.

Figure 13:
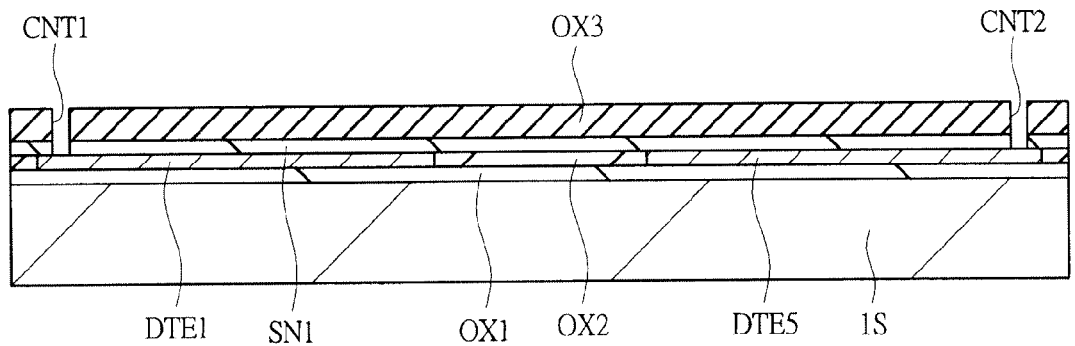
FIG. 13 is a sectional view showing the manufacturing process for the combined sensor following FIG. 12.

As shown in FIG. 13, the insulating film OX3 made of, for example, a silicon oxide film having thickness of about 1 μm to 4 μm is formed on the insulating film SN1. The insulating film OX3 can be formed by using, for example, the CVD method. Thereafter, a contact hole CNT1 reaching the detection electrode DTE1 piercing through the insulating film OX3 and the insulating film SN1 is formed by using a photolithography technique and an etching technique. Similarly, a contact hole CNT2 reaching the detection electrode DTE5 piercing through the insulating film OX3 and the insulating film SN1 is formed by using the photolithography technique and the etching technique.

Figure 14:
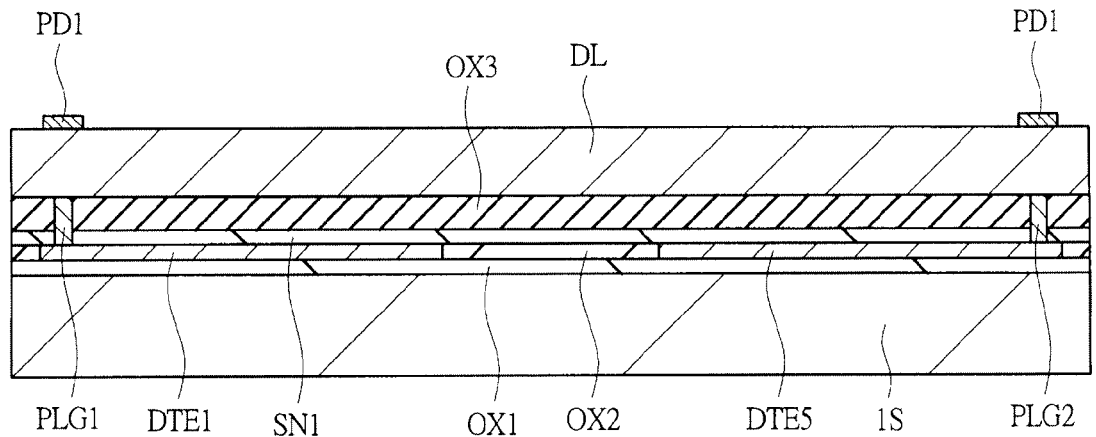
FIG. 14 is a sectional view showing the manufacturing process for the combined sensor following FIG. 13.

Subsequently, as shown in FIG. 14, a polysilicon film is formed on the insulating film OX3 in which the contact hole CNT1 and the contact hole CNT2 are formed. The polysilicon film is formed to fill the insides of the contact hole CNT1 and the contact hole CNT2. An unnecessary polysilicon film formed on the insulating film OX3 is removed using, for example, the CMP method, whereby the polysilicon film is filled only in the contact hole CNT1 and the contact hole CNT2 to form the plug PLG1 and the plug PLG2.

Subsequently, a device layer DL made of, for example, silicon is stuck on the insulating film OX3 in which the plug PLG1 and the plug PLG2 are formed. The device layer DL is formed of, for example, silicon having thickness of several tens micrometers. Actually, it is difficult to stick the silicon having thickness of several tends micrometers directly on the insulating film OX3 because of handling. Therefore, a method of sticking silicon having thickness of several hundred micrometers on the insulating film OX3 and then polishing the silicon to thickness of several tens micrometers is adopted. Thereafter, the pads PD1 are formed on the device layer DL.

Figure 15:
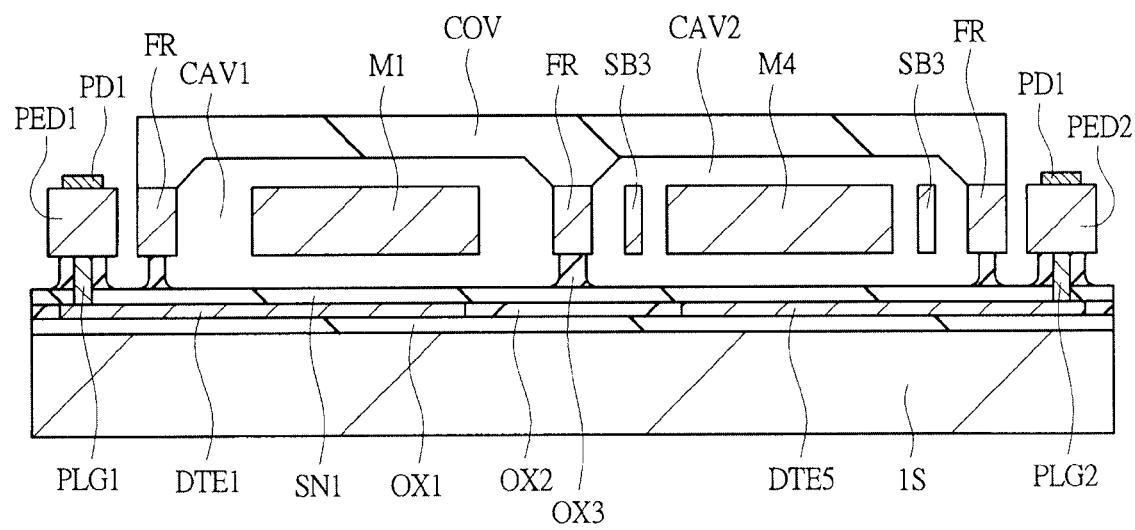
FIG. 15 is a sectional view showing the manufacturing process for the combined sensor following FIG. 14.

Subsequently, as shown in FIG. 15, the device layer DL is machines by using the photolithography technique and the etching technique. Specifically, for example, the pedestal section PED1, the frame body FR, the weight M1, the supporting beam SB3, the weight M4, and the pedestal section PED2 are formed by machining the device layer DL. Although not shown in FIG. 15, for components having relatively large areas such as the weight M1 and the weight M4, etching holes are formed in advance from the viewpoint of reducing time required for etching the insulating layer OX3 functioning as a sacrificial layer. The insulating film OX3 functioning as the sacrificial layer is removed from the etching holes and gaps formed by machining the device layer DL using, for example, hydrofluoric acid. At this point, the insulating film SN1 formed in the lower layer of the insulating film OX3 functions as an etching stopper. Specifically, the insulating film OX3 formed in the lower layers of the weight M1, the supporting beam SB3, the weight M4, and the like is removed and gaps are formed between these components and the insulating film SN1. Consequently, the weight M1, the supporting beam SB3, and the weight M4 change to a movable state. On the other hand, the insulating film OX3 formed in the lower layers of the pedestal section PED1, the frame body FR, and the pedestal section PED2 remains. The pedestal section PED1, the frame body FR, and the pedestal section PED2 are fixed to the semiconductor substrate 1S by the insulating film OX3 formed in the lower layers.

Subsequently, the cover COV is arranged on the frame body FR to seal the cavity section CAV1 in which the weight M1 is formed and the cavity section CAV2 in which the supporting beam SB3 and the weight M4 are formed. At this point, as the cover COV, for example, glass or silicon can be used. The cavity section CAV1 and the cavity section CAV2 can be hermetically sealed by a method such as anodic bonding or surface activated joining. Note that the cover COV can also be sealed using glass frit or an adhesive. As the material of the cover COV, metal or the like can be used. Further, in the cover COV, for the purpose of controlling the pressure in the cavity section CAV1 and the cavity section CAV2, a gas absorbing material (a getter) or a gas generating material (a reverse getter) may be formed. As explained above, the combined sensor in the first embodiment can be manufactured.

<Mounting Configuration of the Combined Sensor in the First Embodiment>

Figure 16:
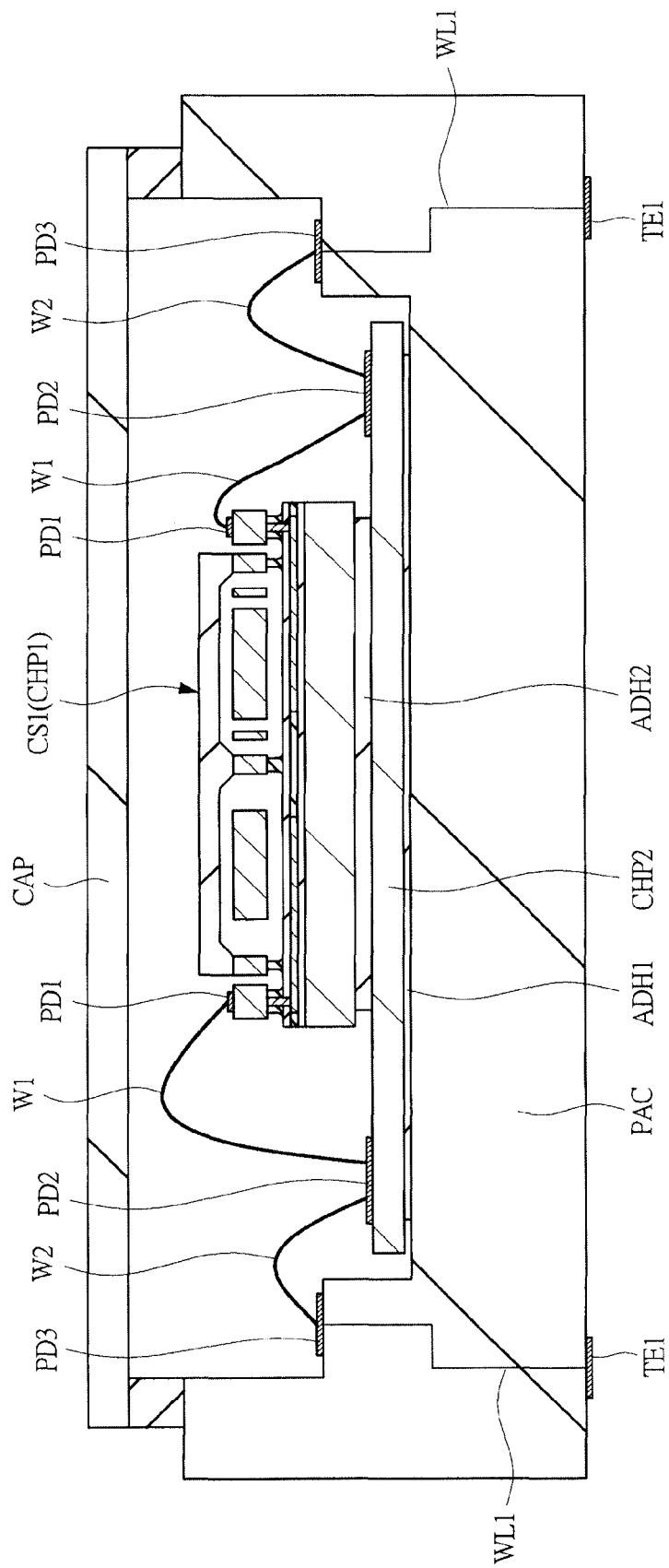
FIG. 16 is a sectional view showing a mounting configuration of the combined sensor in the first embodiment.

A mounting configuration of the combined sensor in the first embodiment is explained. FIG. 16 is a sectional view showing the mounting configuration of the combined sensor in the first embodiment. As shown in FIG. 16, the combined sensor CS1 (a semiconductor chip CHP1) in the first embodiment is mounted on a ceramic package PAC together with a semiconductor chip CHP2 for signal processing. Specifically, the semiconductor chip CHP2 for signal processing is mounted the bottom surface of the ceramic package PAC via an adhesive ADH1. The combined sensor CS1 is mounted on the semiconductor chip CHP2 via an adhesive ADH2. The potential of the semiconductor chip CHP1 can be fixed by configuring the adhesive ADH2 from a conductive adhesive. The pad PD1 formed in the combined sensor CS1 and a pad PD2 formed in the semiconductor chip CHP2 are electrically connected by a wire W1. The pad PD2 formed in the semiconductor chip CHP2 and a pad PD3 formed on the inside of the ceramic package PAC are electrically connected by a wire W2. Further, the pad PD3 formed on the inside of the ceramic package PAC is electrically connected to a terminal TE1, which is formed on the inside of the ceramic package PAC, via wiring WL1. Lastly, an internal space of the ceramic package PAC in which the composite censer CS1 and the semiconductor ship CHP2 for signal processing are sealed by a cap CAP. As explained above, the combined sensor CS1 in the first embodiment is mounted.

Note that, as a package in which the combined sensor CS1 and the semiconductor chip CHP2 for signal processing are placed, a plastic package or the like may be used besides the ceramic package PAC. That is, the package may be any package as long as the package can protect the combined sensor CS1, the semiconductor chip CHP2 for signal processing, the wire W1, the wire W2, and the like and can exchange a signal with the outside.

Second Embodiment

In a second embodiment, an example characterized in that a first reference capacitive element used in an angular-velocity detecting section and a second reference capacitive element used in a Z-direction-acceleration detecting section are formed as a shared one common reference capacitive element is explained.

<Configuration of a Combined Sensor in the Second Embodiment>

Figure 17:
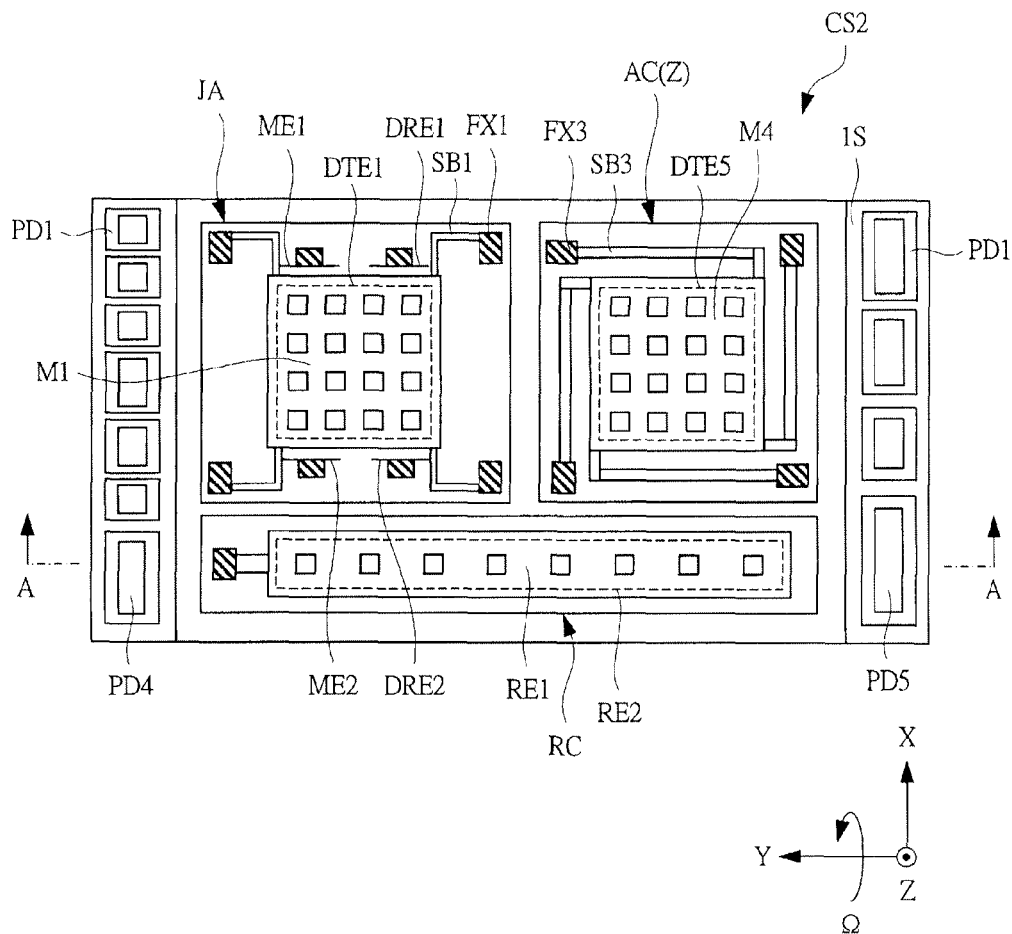
FIG. 17 is a plan view showing the configuration of a combined sensor in a second embodiment.

FIG. 17 is a plan view showing the configuration of a combined sensor SC2 in the second embodiment. In FIG. 17, the combined sensor SC2 in the second embodiment includes the angular-velocity detecting section JA and the Z-direction-acceleration detecting section AC(Z).

First, the configuration of the angular-velocity detecting section JA is explained. As shown in FIG. 17, the angular-velocity detecting section JA includes the movable weight (the movable section) M1 formed on the semiconductor substrate 1S. The angular-velocity detecting section JA includes the supporting beam SB1 configured to support the weight M1 in a floating state a fixed distance apart from the semiconductor substrate 1S. The supporting beam SB1 is configured to be deformable (elastically deformable) in both of the driving direction (the X direction) and the detecting direction (the Z direction). That is, one end of the supporting beam SB1 is connected to the weight M1 and the other end of the supporting beam SB1 is connected to the fixed section FX1 fixed to the semiconductor substrate 1S.

Further, the angular-velocity detecting section JA includes the driving electrode DRE1 and the driving electrode DRE2 configured to form capacitors between the driving electrodes DRE1 and DRE2 and the weight M1. That is, one driving capacitive element is formed by the weight M1 and the driving electrode DRE1 and another driving capacitive element is formed by the weight M1 and the driving electrode DRE2. For example, the driving capacitive element configured from the driving electrode DRE1 and the weight M1 is configured to be applied with a high-frequency signal (a high-frequency voltage). Electrostatic attraction is generated in the driving capacitive element applied with the high-frequency signal (the high-frequency voltage). The weight M1 can be vibrated by the electrostatic attraction. Similarly, the driving capacitive element configured from the driving electrode DRE2 and the weight M1 is configured the same. Consequently, the weight M1 is driven to vibrate.

The angular-velocity detecting section JA includes the monitor electrode ME1 and the monitor electrode ME2 for watching (monitoring) driving amplitude of the vibrating weight M1. Further, the angular-velocity detecting section JA includes the detection electrode DTE1 for detecting displacement in the detecting direction (the Z-axis direction) when an angular velocity around the Y-axis direction is applied. That is, for example, a detection capacitive element is formed by the weight M1 and the detection electrode DTE1 formed in a lower layer of the weight M1 and is configured to be capable of grasping displacement in the detecting direction as a capacitance change of the detection capacitive element.

The angular-velocity detecting section JA in the first embodiment is configured as a tuning fork structure including two weights. Therefore, when an angular velocity around the Y axis is applied, since a detection capacitive element, the capacitance of which increases, and a detection capacitive element, the capacitance of which decreases, are present, in the angular-velocity detecting section JA in the first embodiment, differential detection between the detection capacitive element, the capacitance of which increases, and the detection capacitive element, the capacitance of which decreases, can be performed. Therefore, it is possible to realize highly sensitive sensing even if a reference capacitive element is not used. On the other hand, the angular-velocity detecting section JA in the second embodiment includes only one weight and does not configure a sound fork structure. That is, in the angular-velocity detecting section JA in the second embodiment, when angular velocity around the Y axis is applied, since only one detection capacitive element, the capacitance of which increases and decreases, is present, differential detection cannot be performed in this state. Therefore, in the angular-velocity detecting section JA in the second embodiment, a reference capacitive element is necessary in order to highly sensitively detect displacement in the Z direction (the detecting direction) by the angular velocity application around the Y axis.

The configuration of the Z-direction-acceleration detecting section AC(Z) is explained. As shown in FIG. 17, the Z-direction-acceleration detecting section AC(Z) includes one movable weight M4 formed on the semiconductor substrate 1S. The Z-direction-acceleration detecting section AC(Z) includes the supporting beam SB3 configured to support the weight M4 in a floating state a fixed distance apart from the semiconductor substrate 1S. The supporting beam SB3 is configured to be deformable (elastically deformable) in the detecting direction (the Z direction). That is, one end of the supporting beam SB3 is connected to the weight M4 and the other end of the supporting beam SB3 is connected to the fixed section FX3 fixed to the semiconductor substrate 1S.

Further, the Z-direction-acceleration detecting section AC(Z) includes the detection electrode DTE5 for detecting displacement in the detecting direction (the Z-axis direction) when acceleration is applied in the Z direction. That is, a detection capacitive element is formed by the weight M4 and the detection electrode DTE5 formed in a lower layer of the weight M4 and is configured to be capable of grasping displacement in the detecting direction (the X-axis direction) as a capacitance change of the detection capacitive element.

The Z-direction-acceleration detecting section AC(Z) in the second embodiment has a configuration same as the configuration of the Z-direction-acceleration detecting section AC(Z) in the first embodiment. Therefore, in the second embodiment, as in the first embodiment, when acceleration in the Z direction is applied, in order to highly sensitively detecting displacement of the weight M4 in the Z direction, a reference capacitive element is necessary together with the detection electrode DTE5.

Therefore, in a combined sensor CS2 in the second embodiment, one reference capacitive element RC is provided on the semiconductor substrate 1S. The reference capacitive element RC is shared by the angular-velocity detecting section JA and the Z-direction-acceleration detecting section AC(Z). That is, in the second embodiment, since reference capacitive elements are necessary in both of the angular-velocity detecting section JA and the Z-direction-acceleration detecting section AC(Z), one reference capacitive element RC that can be shared by the angular-velocity detecting section JA and the Z-direction-acceleration detecting section AC(Z) is formed on the semiconductor substrate 1S. In this way, in the second embodiment, since both of the angular-velocity detecting section JA and the Z-direction-acceleration detecting section AC(Z) share one reference capacitive element RC, it is possible to attain a reduction in size of the combined sensor CS2.

For example, if a reference capacitive element used in the angular-velocity detecting section JA and a reference capacitive element used in the Z-direction-acceleration detecting section AC(Z) are separately formed, it is necessary to form the two reference capacitive element on the semiconductor substrate 1S. Therefore, a reduction in size of the combined sensor cannot be attained. On the other hand, as in the second embodiment, if both of the angular-velocity detecting section JA and the Z-direction-acceleration detecting section AC(Z) are configured to share one reference capacitive element RC, it is possible to attain a reduction in size of the combined sensor SC2. In FIG. 17, such a reference capacitive element RC includes an upper electrode RE1 and a lower electrode RE2.

Figure 18:
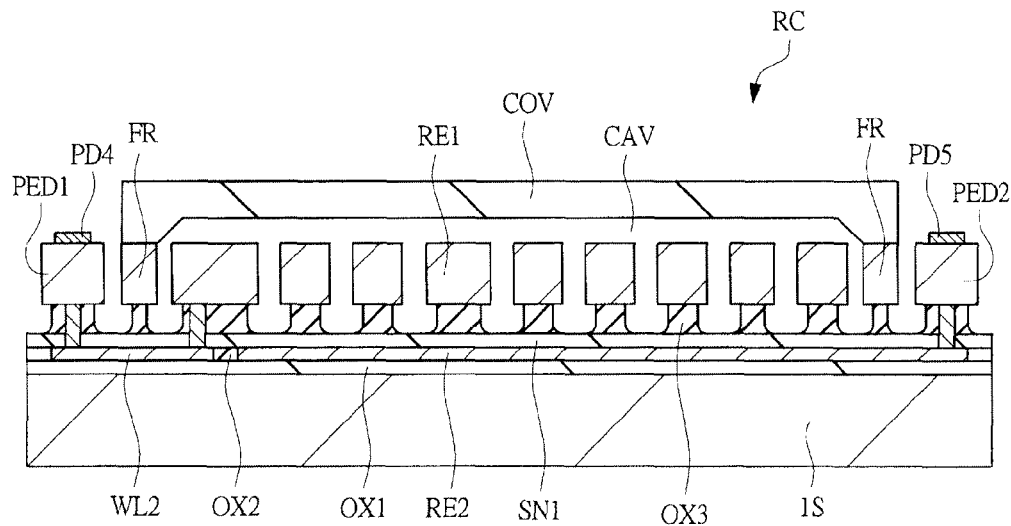
FIG. 18 is a sectional view taken along line A-A in FIG. 17.

Subsequently, a sectional structure of the reference capacitive element RC is explained. FIG. 18 is a diagram showing the sectional structure of the reference capacitive element RC and is a sectional view taken along line A-A in FIG. 17. In FIG. 18, a silicon oxide film OX1 is formed on the semiconductor substrate 1S. Wiring WL2 and the lower electrode RE2 are formed on the silicon oxide film OX1. A silicon oxide film OX2 is embedded in a gap between the wiring WL2 and the lower electrode RE2. A silicon nitride film SN1 is formed on the wiring WL2 and the lower electrode RE2. A silicon oxide film OX3 is formed on the silicon nitride film SN1. The upper electrode RE1 is formed on the silicon oxide film OX3. The frame body FR, the pedestal section PED1, and the pedestal section PED2 are formed in the same layer as the upper electrode RE1. A plurality of etching holes are formed in the upper electrode RE1. A part of the silicon oxide film OX3 is removed via the etching holes. Further, the cover COV is arranged on the frame body FR. A cavity section CAV in which the upper electrode RE1 is formed is sealed.

The reference capacitive element RC configured in this way includes the upper electrode RE1 and the lower electrode RE2. The upper electrode RE1 is electrically connected to a pad PD4 via the wiring WL2 and the pedestal section PED1. On the other hand, the lower electrode RE2 is electrically connected to a pad PD5 via the pedestal section PED2. A capacitive insulating film of the reference capacitive element RC is formed from the silicon nitride film formed between the upper electrode RE1 and the lower electrode RE2 and the silicon oxide film OX3.

<Operation of the Combined Sensor in the Second Embodiment>

Figure 19:
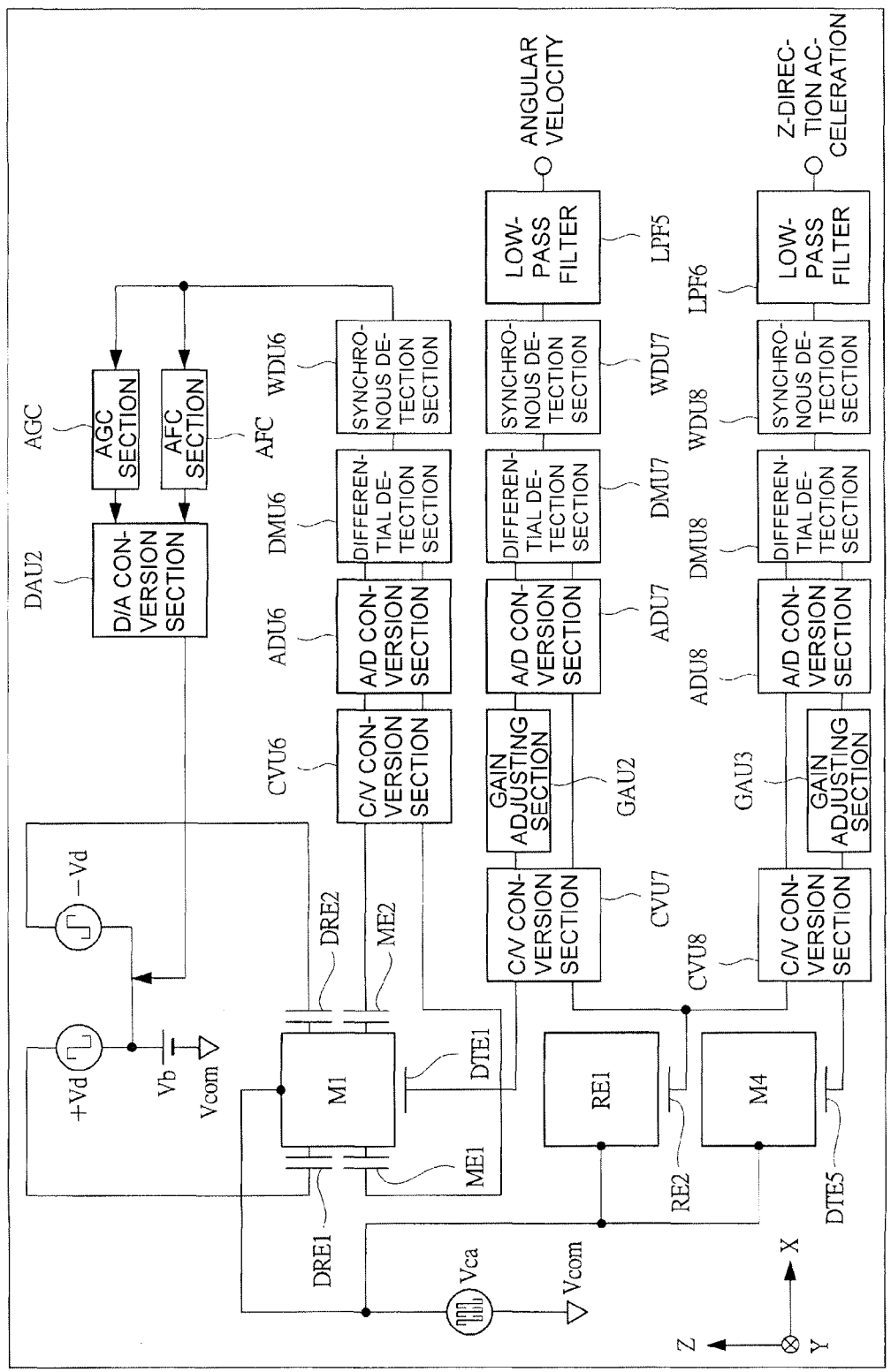
FIG. 19 is a circuit block diagram showing a circuit configuration of the combined sensor in the second embodiment.

The combined sensor CS2 in the second embodiment is configured as explained above. An operation for detecting an angular velocity using the combined sensor CS2 configured in this way is explained with reference to FIG. 19. FIG. 19 is a circuit block diagram showing a circuit configuration of the combined sensor in the second embodiment.

First, in FIG. 19, the weight M1 is excited in the X direction by the driving electrode DRE1 arranged on the left side of the weight M1 and the driving electrode DRE2 arranged on the right side of the weight M1. Specifically, Vcom+Vb+Vd is applied to the driving electrode DRE1 as a driving signal and Vcom+Vb−Vd is applied to the driving electrode DRE2 as a driving signal. On the other hand, Vcom+Vca is applied to the weight M1. Therefore, for example, a potential difference between the weight M1 and the driving electrode DRE1 is Vb+Vd and a potential difference between the weight M1 and the driving electrode DRE2 is Vb−Vd. At this point, driving capacitive elements are respectively formed by the driving electrode DRE1 and the weight M1 and the driving electrode DRE2 and the weight M1. The potential difference explained above is generated in these driving capacitive elements. Consequently, an electrostatic force is generated in each of the driving capacitive elements. The weight M1 vibrates on the basis of the electrostatic force.

In the angular-velocity detecting section in the second embodiment, the driving amplitude AX is monitored using the monitor electrode ME1 arranged on the left side of the weight M1 and the monitor electrode ME2 arranged on the right side of the weight M1. Specifically, the driving amplitude AX is monitored by detecting capacitance changes of monitor capacitive elements respectively configured by the weight M1 and the monitor electrode ME1 and the weight M1 and the monitor electrode ME2.

Specifically, the carrier voltage (Vca) of several hundred kilohertz is applied to the weight M1. The carrier voltage (Vca) causes movement of charges in the monitor electrode ME1 and the monitor electrode ME2 according to the capacitance of the monitor capacitive elements. According to the movement of the charges in the monitor electrode ME1, a first analog voltage signal for monitor is generated in a C/V conversion section CVU6. Similarly, according to the movement of the charges in the monitor electrode ME2, a second analog voltage signal for monitor is generated in the C/V conversion section CVU6. The first analog voltage signal for monitor and the second analog voltage signal for monitor generated in the C/V conversion section CVU6 are respectively converted into a first digital voltage signal for monitor and a second digital voltage signal for monitor in an A/D conversion section ADU6. Thereafter, the first digital voltage signal for monitor and the second digital voltage signal for monitor output from the A/D conversion section ADU6 are input to a differential detection section DMU6 and a difference between the first digital voltage signal for monitor and the second digital voltage signal for monitor is calculated. Specifically, the differential detection section DMU6 calculates a difference between the first digital voltage signal for monitor and the second digital voltage signal for monitor and outputs a differential voltage signal for monitor.

When the weight M1 is driven to vibrate, that is, when the driving amplitude AX is not zero, the carrier voltage (Vca) and the driving voltage (+Vd or −Vd) are applied to the weight M1. Therefore, when the weight M1 is driven to vibrate, in proportion to the driving amplitude AX of the weight M1, for example, a change in which the capacitance of the monitor capacitive element including the monitor electrode ME1 as a component increases and the capacitance of the monitor capacitive element including the monitor electrode ME2 as a component decreases or a change in which the capacitance of the monitor capacitive element including the monitor electrode ME1 as a component decreases and the capacitance of the monitor capacitive element including the monitor electrode ME2 increases occurs. Therefore, the first analog voltage signal for monitor and the second analog voltage signal for monitor generated in the C/V conversion section CVU6 are different. The first digital voltage signal for monitor obtained by converting the first analog voltage signal for monitor in the A/D conversion section ADU6 and the second digital voltage signal for monitor obtained by converting the second analog voltage signal for monitor in the A/D conversion section ADU6 are also different. Therefore, when the weight M1 is driven to vibrate, the differential voltage signal for monitor proportional to the driving amplitude AX is output from the differential detection section DMU6.

The differential voltage signal for monitor output from the differential detection section DMU6 is converted (demodulated) from a signal having a carrier frequency into a signal having a driving frequency (e.g., several tens kilohertz) and further converted (demodulated) from the signal having the driving frequency into a signal having a low frequency (DC to several hundred hertz) in a synchronous detection section WDU6. The driving amplitude AX converted into the signal having the low frequency in this way is input to the AGC section AGC and compared with a target value set in advance. The magnitude of the driving voltage Vd (−Vd) is adjusted via the D/A conversion section DAU2 on the basis of a result of the comparison. In this way, it is possible to perform feedback control to adjust the driving amplitude AX to the target value set in advance.

The feedback control for keeping the driving amplitude AX constant is explained above. Further, in the second embodiment, the frequency (the driving frequency) of the driving voltage (Vd or −Vd) for driving to vibrate the weight M1 is also controlled to be constant. In the second embodiment, in order to cause the driving frequency to follow fluctuation in the peculiar number of vibrations of the driving vibration system due to fluctuation in the ambient environment, feedback control is performed using PLL (Phase Locked Loop). Specifically, AFC (Auto Frequency Control) is carried out by an AFC section AFC shown in FIG. 19.

It is assumed that, in a state in which the weight M1 is driven to vibrate, the angular velocity Ω is applied around the Y axis. In this case, when the angular velocity Ω is applied around the Y axis, in the weight M1, a Coriolis force is generated in the detecting direction (the Z direction). When the Coriolis force is generated, vibration (detection amplitude z) in the detecting direction (the Z direction) proportional to the applied angular velocity occurs. When the vibration in the detecting direction that occurs, the capacitance of the detection capacitive element formed by the weight M1 and the detection electrode DTE1 changes. Movement of charges is caused in the detection electrode DTE1 according to such a change in the capacitance of the detection capacitive element. According to the movement of the charges in the detection electrode DTE1, a first analog voltage signal for detection is generated in a C/V conversion section CVU7. On the other hand, the carrier voltage (Vca) is also applied to the reference capacitive element configured by the upper electrode RE1 and the lower electrode RE2. A second analog voltage signal for reference is generated in the C/V conversion section CVU7 according to movement of charges proportional to capacitance between the upper electrode RE1 and the lower electrode RE2.

The first analog voltage signal for detection output from the C/V conversion section CVU7 is input to a gain adjusting section GAU2 and the magnitude of the first analog voltage signal for detection is adjusted. Thereafter, the first analog voltage signal for detection and the second analog voltage signal for reference are respectively converted into a first digital voltage signal for detection and a second digital voltage signal for reference in an A/D conversion section ADU7. Thereafter, the first digital voltage signal for detection and the second digital voltage signal for reference output from the A/D conversion section ADU7 is input to a differential detection section DMU7 and a difference between the first digital voltage signal for detection and the second digital voltage signal for reference is calculated. Specifically, the differential detection section DMU7 calculates a difference between the first digital voltage signal for detection and the second digital voltage signal for reference and outputs a differential voltage signal for detection.

The differential voltage signal for detection output from the differential detection section DMU7 is converted (demodulated) from a signal having a carrier frequency into a signal having a driving frequency (e.g., several tens kilohertz) and further converted (demodulated) from the signal having the driving frequency into a signal (a demodulated voltage signal for detection) having a low frequency (DC to several hundred hertz) in a synchronous detection section WDU7. A high-frequency component of the signal having the low frequency converted in this way is removed in a low-pass filter LPF5. A signal corresponding to the angular velocity is output. In this way, it is possible to detect the angular velocity around the Y axis.

Subsequently, an operation for detecting acceleration in the Z direction is explained with reference to FIG. 19. First, in FIG. 19, the carrier voltage (Vca) of several hundred kilohertz is applied to the weight M4 and a reference capacitive element. The carrier voltage (Vca) causes movement of charges in the lower electrode RE2 and the detection electrode DTE5 according to the capacitance of a detection capacitive element and the capacitance of the reference capacitive element. According to the movement of the charges in the detection electrode DTE5, a first analog voltage signal for Z-direction detection is generated in a C/V conversion section CVU8. Similarly, according to the movement of the charges in the lower electrode RE2 of the reference capacitive element, a second analog voltage signal for reference is generated in the C/V conversion section CVU8. The first analog voltage signal for Z-direction detection output from the C/V conversion section CVU8 is input to a gain adjusting section GAU3 and the magnitude of the first analog voltage signal for Z-direction detection is adjusted. Thereafter, the second analog voltage signal for reference generated in the C/V conversion section CVU8 and the first analog voltage signal for Z-direction detection, the magnitude of which is adjusted in the gain adjusting section GAU3, are respectively converted into a first digital voltage signal for Z-direction detection and a second digital voltage signal for reference in an A/D conversion section ADU8. Thereafter, the first digital voltage signal for Z-direction detection and the second digital voltage signal for reference output from the A/D conversion section ADU8 are input to a differential detection section DMU8 and a difference between the first digital voltage signal for Z-direction detection and the second digital voltage signal for reference is calculated. Specifically, the differential detection section DMU8 calculates a difference between the first digital voltage signal for Z-direction detection and the second digital voltage signal for reference and outputs a differential voltage signal for Z-direction detection.

For example, it is assumed that acceleration is applied in the +Z direction. In this case, the weight M4 is displaced in the +Z direction. Therefore, the capacitance of the detection capacitive element formed by the detection electrode DTE5 and the weight M4 decreases and, on the other hand, the reference capacitance of the reference capacitive element formed by the lower electrode RE2 and the upper electrode RE1 hardly changes. Therefore, since the capacitance of the detection capacitive element formed by the detection electrode DTE5 and the weight M4 and the reference capacitance of the reference capacitive element formed by the lower electrode RE2 and the upper electrode RE1 are different, the second analog voltage signal for reference generated in the C/V conversion section CVU8 and the first analog voltage signal for Z-direction detection output from the gain adjusting section GAU3 are different. The first digital voltage signal for Z-direction detection obtained by converting the first analog voltage signal for Z-direction detection in the A/D conversion section ADU8 and the second digital voltage signal for reference obtained by converting the second analog voltage signal for reference in the A/D conversion section ADU8 are also different. Therefore, for example, when acceleration is applied in the +Z direction, the differential voltage signal for Z-direction detection proportional to the magnitude of the acceleration is output from the differential detection section DMU8.

The differential voltage signal for Z-direction detection output from the differential detection section DMU8 is converted (demodulated) from a signal having a carrier frequency into a signal having a low frequency (DC to several hundred hertz) (a demodulated voltage signal for Z-direction detection) in a synchronous detection section WDU8. A high-frequency component of the signal having the low frequency converted in this way is removed by a low-pass filter LPF6. A signal corresponding to the acceleration in the Z direction is output. In this way, it is possible to detect the acceleration in the Z direction.

In the combined sensor in the second embodiment, the angular-velocity detecting section and the Z-direction-acceleration detecting section refer to the same reference capacitive element. Therefore, it is possible to attain a reduction in size of the combined sensor compared with the combined sensor in which the angular-velocity detecting section and the Z-direction-acceleration detecting section respectively refer to different reference capacitive elements. Further, in the second embodiment, gain adjusting sections are respectively provided in a signal processing section of the angular-velocity detecting section and a signal processing section of the Z-direction-acceleration detecting section. Consequently, it is possible to adjust imbalance between initial capacitance of the detection capacitive element and reference capacitance of the reference capacitive element in the angular-velocity detecting section. Similarly, it is possible to adjust imbalance between initial capacitance of the detection capacitive element and reference capacitance of the reference capacitive element in the Z-direction-acceleration detecting section. Therefore, an effect is obtained that it is possible to separately adjust initial zero offset of the combined sensor.

The invention devised by the inventor is specifically explained above on the basis of the embodiments of the invention. However, the present invention is not limited to the embodiments. It goes without saying that the present invention can be variously changed without departing from the spirit of the present invention.

For example, in a combined sensor in which an acceleration detecting section and a pressure detecting section are integrated, the acceleration detecting section and the pressure detecting section can share a reference capacitive element. In a combined sensor in which an angular-velocity detecting section and a pressure detecting section are integrated, a detection capacitive element of the angular-velocity detecting section can be used as a reference capacitive element of the pressure detecting section. In other combined sensors, detecting sections can be used as reference capacitive elements each other if the detecting sections have different peculiar numbers of vibrations each other.

INDUSTRIAL APPLICABILITY

The present invention can be widely used in the fields of sensors for posture detection for an automobile, a robot, and the like, image stabilization for a digital camera, posture detection and direction detection for a navigation system, posture detection for a game machine, and the like. In particular, it can be expected that the present invention exhibits power thereof in a use in a mobile body and when a vibration generating source such as a motor, a valve, or a speaker is present around a sensor.

REFERENCE SIGNS LIST

1S Semiconductor substrate
AC Acceleration detecting section
AC(XY) XY-direction-acceleration detecting section
AC(Z) Z-direction-acceleration detecting section
ADH1 Adhesive
ADH2 Adhesive
ADU1 A/D conversion section
ADU2 A/D conversion section
ADU3 A/D conversion section
ADU4 A/D conversion section
ADU5 A/D conversion section
ADU6 A/D conversion section
ADU7 A/D conversion section
ADU8 A/D conversion section
AFC section AFC
AGC section AGC
CAP Cap
CAV Cavity section
CAV1 Cavity section
CAV2 Cavity section
CHP1 Semiconductor chip
CHP2 Semiconductor chip
CNT1 Contact hole
CNT2 Contact hole
COV Cover
CS1 Combined sensor
CS2 Combined sensor
CVU1 C/V conversion section
CVU2 C/V conversion section
CVU3 C/V conversion section
CVU4 C/V conversion section CVU5 C/V conversion section
CVU6 C/V conversion section
CVU7 C/V conversion section
CVU8 C/V conversion section
DAU1 D/A conversion section
DAU2 D/A conversion section
DL Device layer
DMU1 Differential detection section
DMU2 Differential detection section
DMU3 Differential detection section
DMU4 Differential detection section
DMU5 Differential detection section
DMU6 Differential detection section
DMU7 Differential detection section
DMU8 Differential detection section
DRE1 Driving electrode
DRE2 Driving electrode
DTE1 Detection electrode
DTE2 Detection electrode
DTE3 Detection electrode
DTE4 Detection electrode
DTE5 Detection electrode
EL1 Electrode
EL2 Electrode
FR Frame body
FX1 Fixed section
FX2 Fixed section
FX3 Fixed section
GAU1 Gain adjusting section
GAU2 Gain adjusting section
GAU3 Gain adjusting section
JA Angular-velocity detecting section
LB Link beam
LPF1 Low-pass filter
LPF2 Low-pass filter
LPF3 Low-pass filter
LPF4 Low-pass filter
M1 Weight
M2 Weight
M3 Weight
M4 Weight
ME1 Monitor electrode
ME2 Monitor electrode
OX1 Insulating film
OX2 Insulating film
OX3 Insulating film
PAC Ceramic package
PD1 Pad
PD2 Pad
PD3 Pad
PD4 Pad
PD5 Pad
PED1 Pedestal section
PED2 Pedestal section
PLG1 Plug
PLG2 Plug
RC Reference capacitive element
RE1 Upper electrode
RE2 Lower electrode
SB1 Supporting beam
SB2 Supporting beam
SB3 Supporting beam
SN1 Insulating film
TE1 Terminal
W1 Wire
W2 Wire
WDU1 Synchronous detection section
WDU2 Synchronous detection section
WDU3 Synchronous detection section
WDU4 Synchronous detection section
WDU5 Synchronous detection section
WDU6 Synchronous detection section
WDU7 Synchronous detection section
WDU8 Synchronous detection section
WL1 Wire
WL2 Wire

The invention claimed is:

1. A combined sensor comprising:
    (a) a first detecting section configured to grasp application of a first physical quantity as a change in capacitance of a first detection capacitive element; and
    (b) a second detecting section configured to grasp application of a second physical quantity as a change in capacitance of a second detection capacitive element, wherein
    the combined sensor detects the first physical quantity on the basis of a difference between a detection signal obtained by converting the capacitance of the first detection capacitive element output from the first detecting section and a reference signal obtained by converting the capacitance of the second detection capacitive element output from the second detecting section.

2. The combined sensor according to claim 1, wherein the first detecting section includes:
    (a1) a first fixed section fixed to a semiconductor substrate;
    (a2) a first elastic deformable section connected to the first fixed section;
    (a3) a first movable section connected to the first elastically deformable section; and
    (a4) a first detection electrode formed on the semiconductor substrate,
    the first detection capacitive element is formed by the first movable section and the first detection electrode,
    the second detecting section includes:
    (b1) a second fixed section fixed to the semiconductor substrate;
    (b2) a second elastically deformable section connected to the second fixed section;
    (b3) a second movable section connected to the second elastically deformable section; and
    (b4) a second detection electrode formed on the semiconductor substrate, and
    the second detection capacitive element is formed by the second movable section and the second detection electrode.

3. The combined sensor according to claim 2, wherein a peculiar number of vibrations of a detection vibration system in the first detecting section is smaller than a peculiar number of vibrations of a detection vibration system in the second detecting section.

4. The combined sensor according to claim 1, further comprising a gain adjusting section configured to adjust, when the first physical quantity is not applied, a difference between the detection signal and the reference signal to be zero.

5. The combined sensor according to claim 1, wherein the first physical quantity is acceleration, and the second physical quantity is an angular velocity.

6. The combined sensor according to claim 1, wherein the first detection capacitive element of the first detecting section detects a capacitance change based on displacement in a direction perpendicular to a principal plane of the semiconductor substrate, and
    the second detection capacitive element of the second detecting section detects a capacitance change based on displacement in the direction perpendicular to the principal plane of the semiconductor substrate.

7. The combined sensor according to claim 1, further comprising a capacitance-to-voltage conversion section configured to convert the capacitance of the first detection capacitive element output from the first detecting section into a first voltage signal and convert the capacitance of the second detection capacitive element output from the second detecting section into a second voltage signal.

8. The combined sensor according to claim 7, wherein
a carrier wave is applied to the first detecting section and the second detecting section, and
a signal pass band of the capacitance-to-voltage conversion section is larger than a value obtained by subtracting a peculiar number of vibrations of the second detecting section from a frequency of the carrier wave and smaller than a value obtained by adding up the frequency of the carrier wave and the peculiar number of vibrations of the second detecting section.

9. The combined sensor according to claim 1, wherein
the first physical quantity is acceleration in a first direction, and
the second physical quantity is acceleration in a second direction different from the first direction.

10. The combined sensor according to claim 9, wherein
the first direction is an in-plane direction of the principal plane of the semiconductor substrate, and
the second direction is an out-of-plane direction, which is a direction perpendicular to the principal plane of the semiconductor substrate.

11. A combined sensor comprising:
(a) a first detecting section configured to grasp application of a first physical quantity as a change in capacitance of a first detection capacitive element;
(b) a second detecting section configured to grasp application of a second physical quantity as a change in capacitance of a second detection capacitive element; and
(c) a reference capacitive element set as a reference for calculating a difference, wherein
the combined sensor detects the first physical quantity on the basis of a difference between a first detection signal obtained by converting the capacitance of the first detection capacitive element output from the first detecting section and a reference signal obtained by converting the capacitance of the reference capacitive element and detects the second physical quantity on the basis of a difference between a second detection signal obtained by converting the capacitance of the second detection capacitive element output from the second detecting section and the reference signal obtained by converting the capacitance of the reference capacitive element.

12. The combined sensor according to claim 11, wherein the first detecting section includes:
(a1) a first fixed section fixed to a semiconductor substrate;
(a2) a first elastic deformable section connected to the first fixed section;
(a3) a first movable section connected to the first elastically deformable section; and
(a4) a first detection electrode formed on the semiconductor substrate,
the first detection capacitive element is formed by the first movable section and the first detection electrode,
the second detecting section includes:
(b1) a second fixed section fixed to the semiconductor substrate;
(b2) a second elastically deformable section connected to the second fixed section;
(b3) a second movable section connected to the second elastically deformable section; and
(b4) a second detection electrode formed on the semiconductor substrate, and
the second detection capacitive element is formed by the second movable section and the second detection electrode.

13. The combined sensor according to claim 11, further comprising:
a first gain adjusting section configured to adjust, when the first physical quantity is not applied, a difference between the first detection signal and the reference signal to be zero; and
a second gain adjusting section configured to adjust, when the second physical quantity is not applied, a difference between the second detection signal and the reference signal to be zero.

14. The combined sensor according to claim 11, wherein
the first physical quantity is acceleration, and
the second physical quantity is an angular velocity.

* * * * *